US010347834B2

(12) United States Patent
Thomas et al.

(10) Patent No.: US 10,347,834 B2
(45) Date of Patent: Jul. 9, 2019

(54) WAFER-SCALE INTEGRATION OF VACANCY CENTERS FOR SPIN QUBITS

(71) Applicant: INTEL CORPORATION, Santa Clara, CA (US)

(72) Inventors: Nicole K. Thomas, Portland, OR (US); Marko Radosavljevic, Portland, OR (US); Sansaptak Dasgupta, Hillsboro, OR (US); Ravi Pillarisetty, Portland, OR (US); Kanwaljit Singh, Rotterdam (NL); Hubert C. George, Portland, OR (US); Jeanette M. Roberts, North Plains, OR (US); David J. Michalak, Portland, OR (US); Roman Caudillo, Portland, OR (US); Zachary R. Yoscovits, Beaverton, OR (US); Lester Lampert, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/928,220

(22) Filed: Mar. 22, 2018

(65) Prior Publication Data

US 2019/0044066 A1 Feb. 7, 2019

(51) Int. Cl.
*H01L 49/00* (2006.01)
*G02B 6/12* (2006.01)
(Continued)

(52) U.S. Cl.
CPC ........ *H01L 49/006* (2013.01); *G02B 6/12004* (2013.01); *G06N 10/00* (2019.01);
(Continued)

(58) Field of Classification Search
None
See application file for complete search history.

(56) References Cited

U.S. PATENT DOCUMENTS 8,758,509 B2 * 6/2014 Twitchen ................ C30B 29/04
117/104
9,823,313 B2 * 11/2017 Hahn .................. G01R 33/0052
(Continued)

FOREIGN PATENT DOCUMENTS

WO WO-2007103419 A2 * 9/2007 ............. B82Y 20/00

OTHER PUBLICATIONS

Casanova, J., et al., "Noise-resilient Quantum Computing with a Nitrogen-Vacancy Center and Nuclear Spins," arXiv:1602.06862v2 [quant-ph], Sep. 20, 2016; 13 pages.
(Continued)

*Primary Examiner* — Sung H Pak
(74) *Attorney, Agent, or Firm* — Patent Capital Group

(57) ABSTRACT

Embodiments of the present disclosure propose two methods for integrating vacancy centers (VCs) on semiconductor substrates for forming VC-based spin qubit devices. The first method is based on using a self-assembly process for integrating VC islands on a semiconductor substrate. The second method is based on using a buffer layer of a III-N semiconductor material over a semiconductor substrate, and then integrating VC islands in an insulating carbon-based material such as diamond that is either grown as a layer on the III-N buffer layer or grown in the openings formed in the III-N buffer layer. Integration of VC islands on semiconductor substrates typically used in semiconductor manufacturing according to any of these methods may provide a substantial improvement with respect to conventional approaches to building VC-based spin qubit devices and may promote wafer-scale integration of VC-based spin qubits for use in quantum computing devices.

35 Claims, 14 Drawing Sheets

(51) Int. Cl.
*G06N 10/00* (2019.01)
*B82Y 10/00* (2011.01)
*B82Y 40/00* (2011.01)
*B82Y 20/00* (2011.01)

(52) U.S. Cl.
CPC ............... *B82Y 10/00* (2013.01); *B82Y 20/00* (2013.01); *B82Y 40/00* (2013.01); *Y10S 977/814* (2013.01); *Y10S 977/933* (2013.01)

(56) References Cited

U.S. PATENT DOCUMENTS

| | | | | |
|---|---|---|---|---|
| 2008/0063339 A1* | 3/2008 | Spillane | ............... | B82Y 10/00 385/14 |
| 2008/0096308 A1* | 4/2008 | Santori | ............... | G02B 6/122 438/105 |
| 2010/0315079 A1* | 12/2010 | Lukin | ............... | G01R 33/032 324/244.1 |
| 2013/0107352 A1* | 5/2013 | Santori | ............... | G06N 99/002 359/346 |

OTHER PUBLICATIONS

Childress, Lilian, et al., "Diamond NV centers for quantum computing and quantum networks," Materials Research Society, MRS Bulletin, vol. 38, Feb. 2013; 5 pages.

Haque, Ariful, et al., "An Overview on the Formation and Processing of Nitrogen-Vacancy Photonic Centers in Diamond by Ion Implantation," Journal of Manufacturing and Materials Processing, Aug. 25, 2017; 16 pages.

Hardesty, Larry, "Toward Mass-Producible Quantum Computers: Process for positioning quantum bits in diamond optical circuits could work at large scales," MIT News, May 26, 2017; 3 pages.

Hu, Yaowen, et al., "Quantum interface between a transmon qubit and spins of nitrogen-vacancy centers," arXiv:1709.08508 [quant-ph], Sep. 25, 2017; 24 pages.

Nemoto, Kae, et al., "Photonic Quantum Networks formed from NV⁻ centers," Scientific Reports 6:26284, May 24, 2016; 12 pages.

* cited by examiner

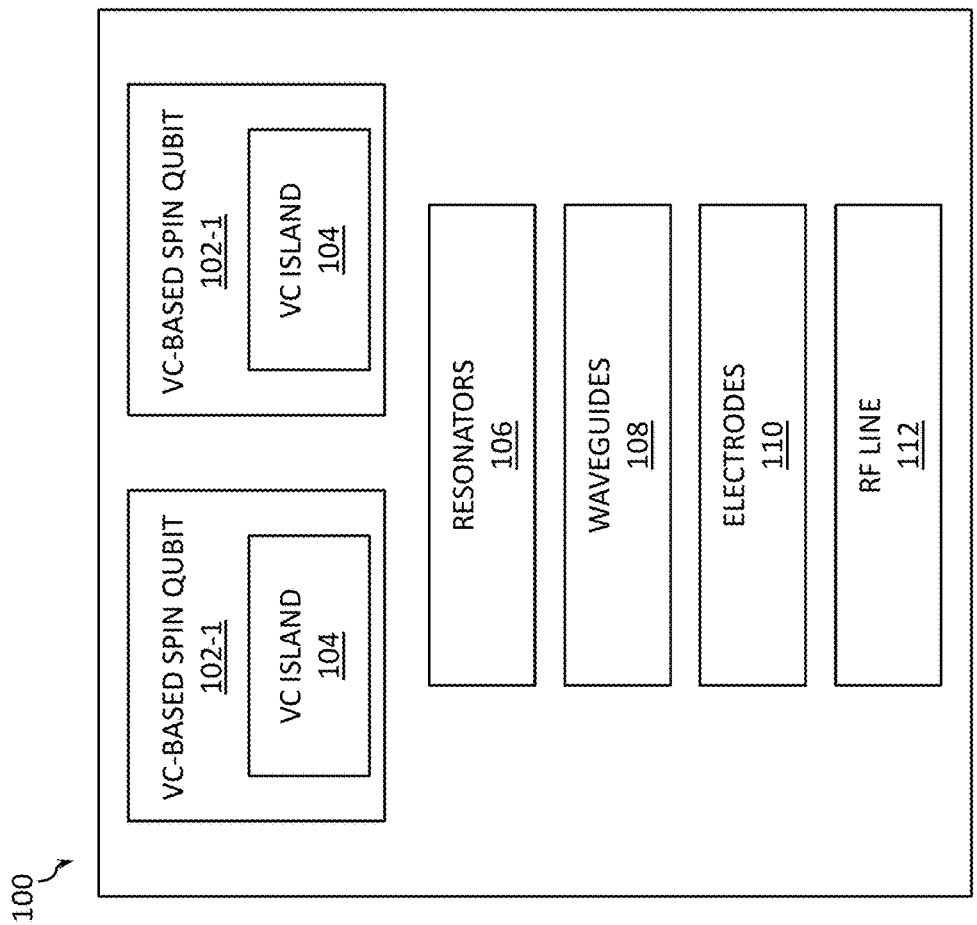

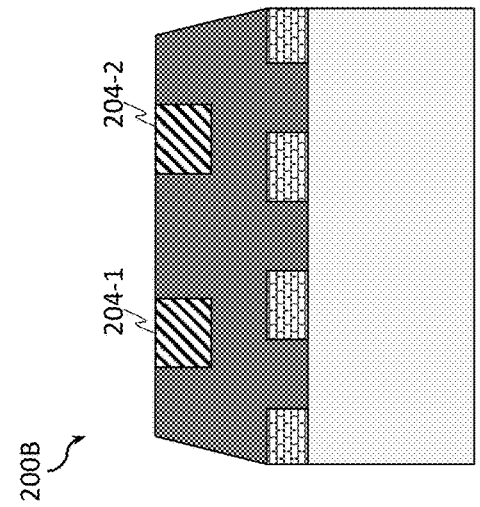
FIG. 2A
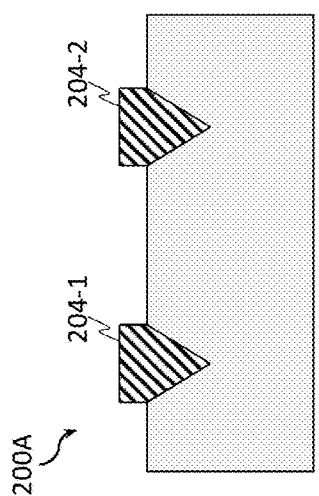
FIG. 2B
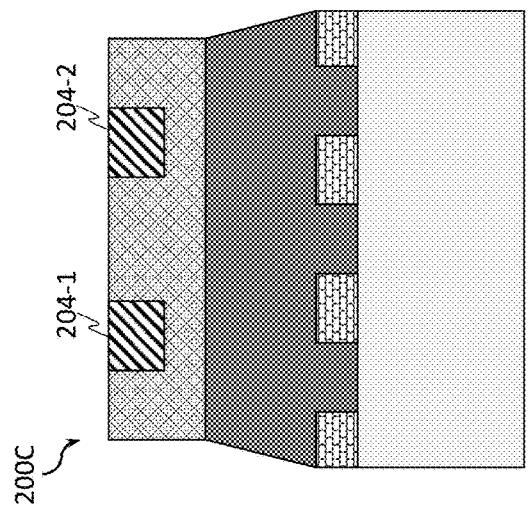
FIG. 2C
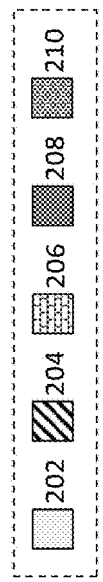

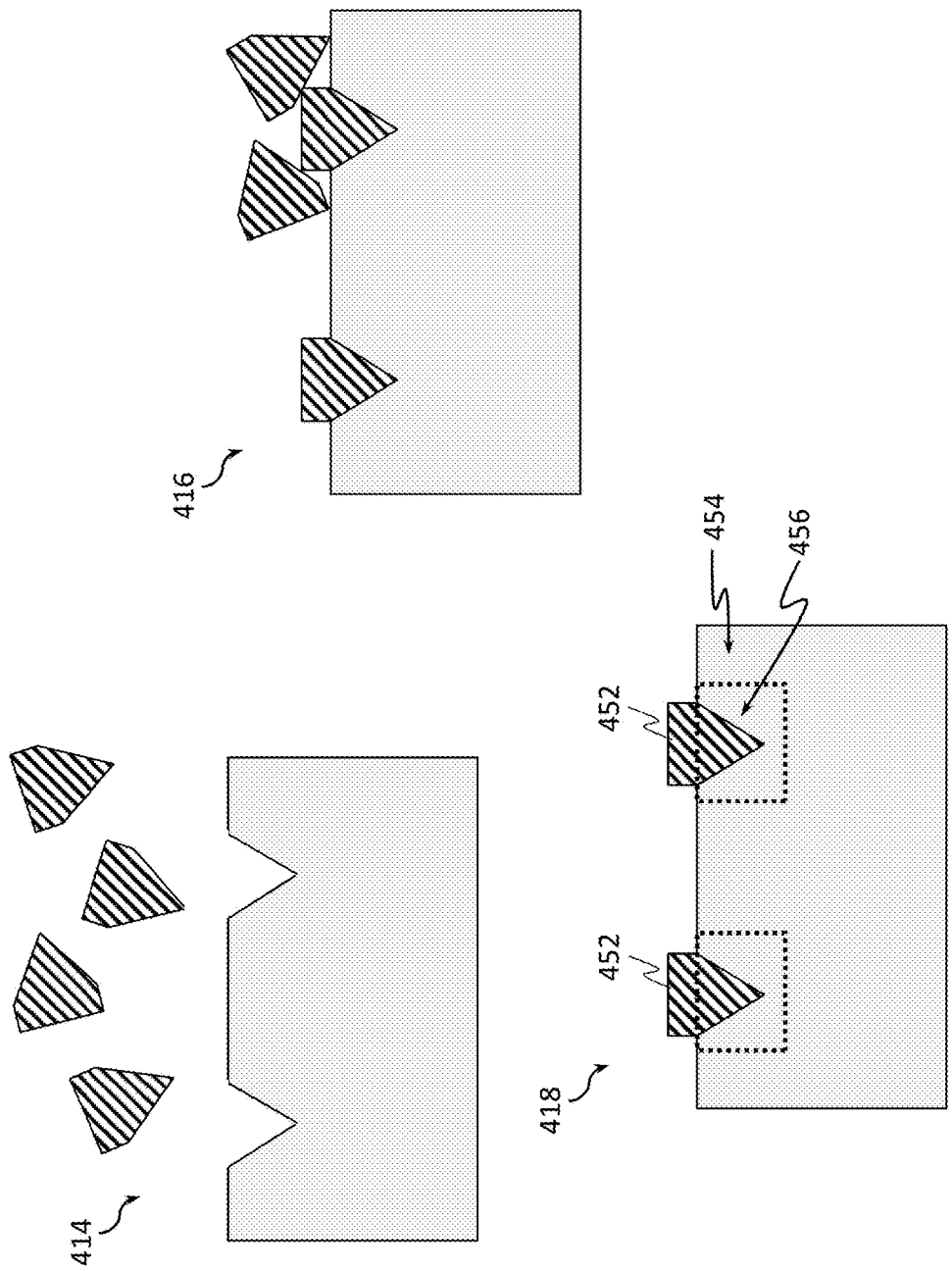

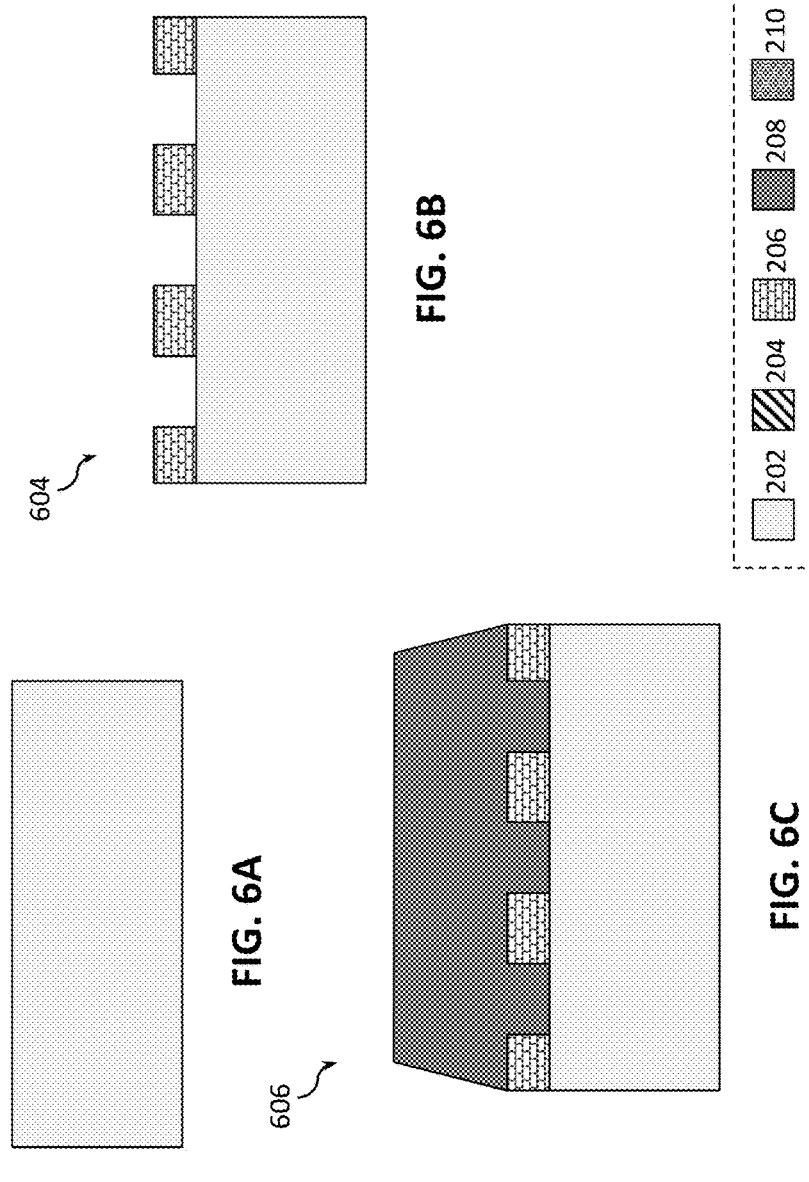

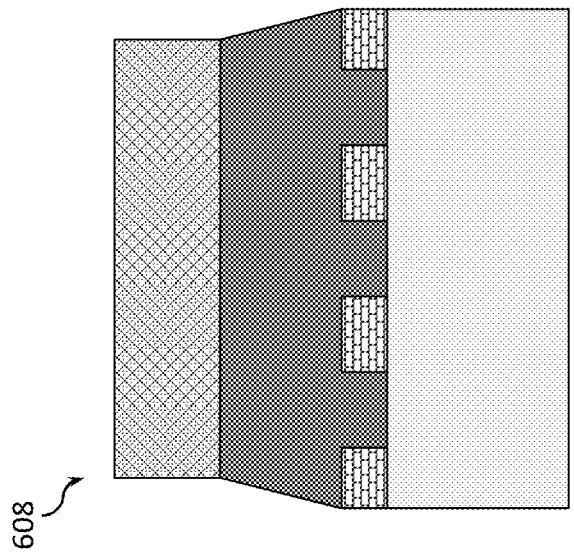
FIG. 6D
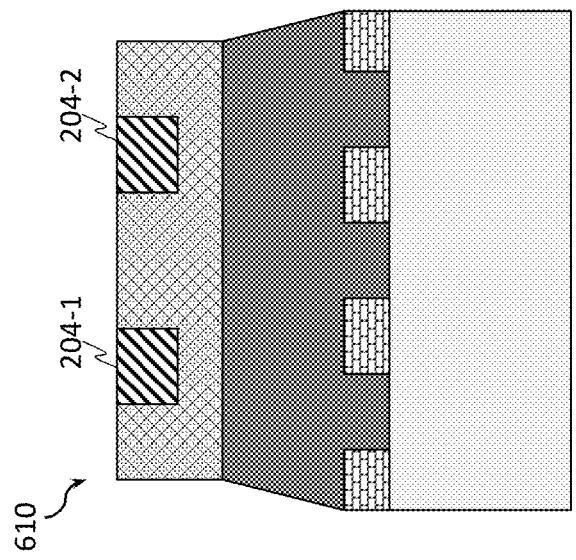
FIG. 6E
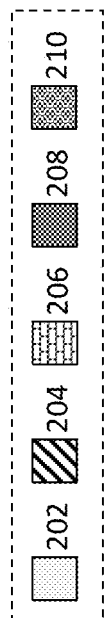

WAFER-SCALE INTEGRATION OF VACANCY CENTERS FOR SPIN QUBITS

TECHNICAL FIELD

This disclosure relates generally to the field of quantum computing, and more specifically, to vacancy centers (VCs) for use in quantum circuits and to methods of fabrication thereof.

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Compared to well-established and thoroughly researched classical computers, quantum computing is still in its infancy, with the highest number of qubits in a solid-state quantum processor currently being below 100. One of the main challenges resides in protecting qubits from decoherence so that they can stay in their information-holding states long enough to perform the necessary calculations and read out the results. Another challenge resides in integrating quantum circuits on wafers used by leading edge device manufactures.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 provides a schematic illustration of an exemplary quantum circuit with VC-based spin qubits, according to some embodiments of the present disclosure.

FIGS. 2A-2C illustrate exemplary layout designs of VC islands integrated on a semiconductor substrate, according to various embodiments of the present disclosure.

FIGS. 4A-4E are various views illustrating different exemplary stages in the manufacture of a spin qubit device assembly using the self-assembly method of FIG. 3, in accordance with some embodiments of the present disclosure.

FIGS. 6A-6E are various views illustrating different exemplary stages in the manufacture of a spin qubit device assembly using the buffer-based method of FIG. 5, in accordance with some embodiments of the present disclosure.

DETAILED DESCRIPTION

Overview

Figure 3:
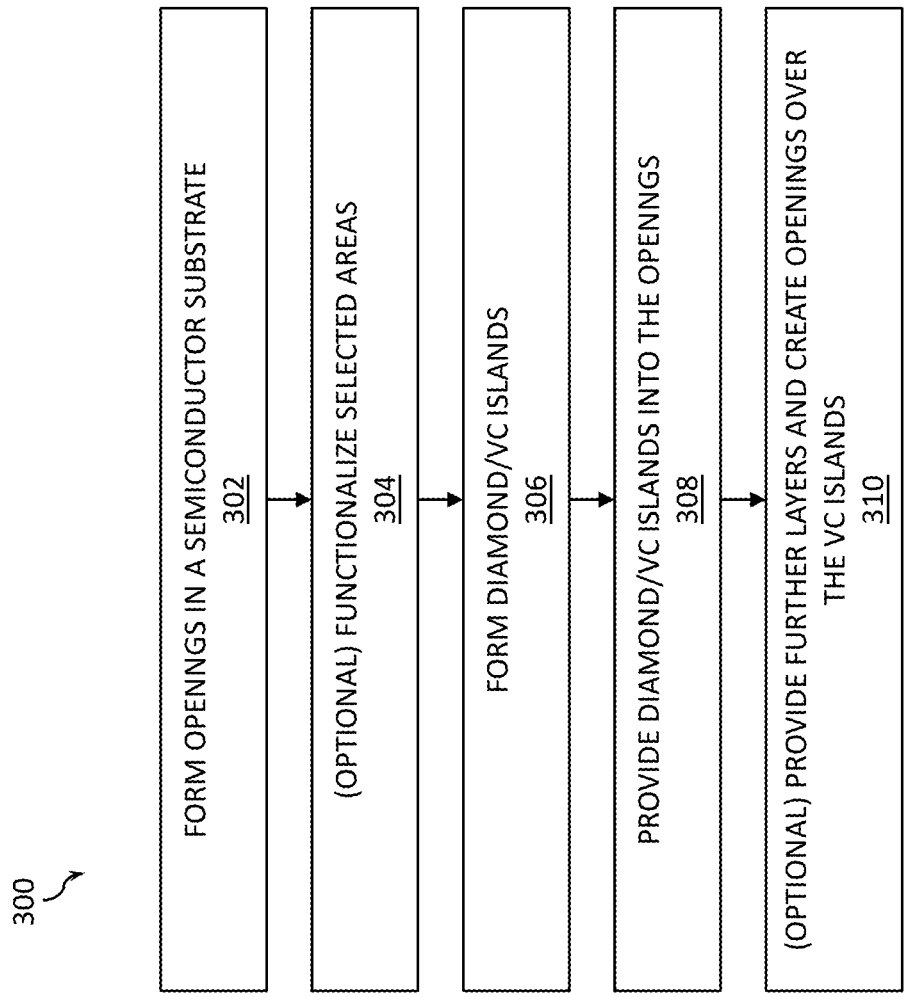
FIG. 3 provides a flow chart of a self-assembly method for integrating VC islands for VC-based spin qubits on a semiconductor substrate, according to some embodiments of the present disclosure.

As briefly described above, quantum computing, or quantum information processing, refers to the field of research related to computation systems that use quantum-mechanical phenomena to manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles being generated or interacting in such a way that the state of one particle becomes intertwined with that of the others. Furthermore, the quantum state of each particle cannot be described independently. Instead, the quantum state is given for the group of entangled particles as a whole. Yet another example of quantum-mechanical phenomena is sometimes described as a "collapse" because it asserts that when we observe (measure) particles, we unavoidably change their properties in that, once observed, the particles cease to be in a state of superposition or entanglement (i.e. by trying to ascertain anything about the particles, we collapse their state).

Put simply, superposition postulates that a given particle can be simultaneously in two states, entanglement postulates that two particles can be related in that they are able to instantly coordinate their states irrespective of the distance between them in space and time, and collapse postulates that when one observes a particle, one unavoidably changes the state of the particle and its' entanglement with other particles. These unique phenomena make manipulation of data in quantum computers significantly different from that of classical computers (i.e. computers that use phenomena of classical physics). Therefore, both the industry and the academics continue to focus on a search for new and improved physical systems whose functionality could approach that expected of theoretically designed qubits.

Physical systems for implementing qubits that have been explored until now include e.g. superconducting qubits, quantum dot spin qubits, donor-based spin qubits, VC-based spin qubits, single trapped ion qubits, photon polarization qubits, etc. Out of the various physical implementations of qubits, VC-based spin qubits are promising candidates for building a quantum computer. A VC is a defect formed in an insulating carbon-based material, e.g. diamond (i.e. a metastable allotrope of carbon were the carbon atoms are arranged in a variation of the face-center cubit (FCC) crystal structure referred to as a "diamond lattice"), by one substitutional atom and an adjacent vacancy. A VC forms a triplet, i.e. a quantum state of a system characterized by having three allowed values of a spin component (i.e. three allowed spin states), and, hence, may be used to form a spin qubit. Advantageously, VCs may be controlled, e.g. initialized (i.e. set) and read out, using optical excitation, and have relatively long coherence times at room temperatures. Potential for coherently controlling VCs at room temperatures using optical excitation is very valuable, making VC-based spin qubits worth pursuing for various quantum computing applications.

In academic settings, VCs are typically formed in a block of diamond, using implant or delta-doping. While such an approach may be adequate for fabricating VC-based spin qubit devices in a lab environment, it has a low yield, is expensive, and is not consistent with wafer-scale manufacturing techniques used in the semiconductor industry.

VCs are integral building blocks in quantum circuits implementing VC-based spin qubits, where they form the basis of quantum circuit elements that can approximate functionality of theoretically designed qubits. Therefore, improvements with respect to wafer-scale integration of VCs for use in quantum circuit assemblies are desirable. In particular, it would be desirable to have methods for fabricating VC-based spin qubit devices that have adequate performance and can be manufactured using wafer-scale techniques, e.g. very-large-scale-integration (VLSI) techniques.

Embodiments of the present disclosure propose different methods of fabricating quantum circuit assemblies, in particular methods of fabricating spin qubit device assemblies that include VCs, as well as spin qubit device assemblies comprising such VCs and various devices comprising such assemblies. In particular, embodiments of the present disclosure provide two methods for integrating VCs on semiconductor substrates, where, in context of the present disclosure integration "on" a substrate is understood to refer to the inclusion of VCs on (i.e. directly on the substrate without any intermediate layers therebetween), over (i.e. where one or more layer may be present between the substrate and the VCs), or at least partially in the substrate. The first method described herein is based on using a self-assembly process for integrating structures referred to as "VC islands" on a semiconductor substrate. Such a method is referred to herein as a "self-assembly method." The second method described herein is based on using a buffer layer of a III-N semiconductor material over a semiconductor substrate, and then integrating VC islands in an insulating carbon-based material such as diamond that is either grown as a layer on the III-N buffer layer or in the openings formed in the III-N buffer layer. As used herein, the term "III-N semiconductor material" refers to semiconductor materials having nitrogen (N) in combination with one or more elements which belong to group III of the periodic table of elements, e.g. GaN. Because of the use of the III-N buffer layer, the second method is referred to herein as a "III-N buffer-based method." Integration of VC islands on semiconductor substrates typically used in semiconductor manufacturing according to any of these methods, i.e. wafer-scale integration of VCs, may provide a substantial improvement with respect to conventional approaches to building VC-based spin qubit devices, such as the one described above, which are not suitable for implementing with wafers used by leading edge device manufactures. Overall, the methods described herein may enable/promote wafer-scale integration of VC-based spin qubits for use in quantum computing devices.

While some descriptions of various embodiments of the present disclosure are provided with reference to diamond, which is one example of an insulating carbon-based materials in which VCs may be formed for use in spin qubits, at least some teachings of the present disclosure may be applicable to quantum circuits implementing defect-based spin qubits using carbon-based materials other than diamond, e.g. point-defects in silicon carbide, which may be integrated on a semiconductor substrate as described herein, all of such implementations being within the scope of the present disclosure. In addition, while some descriptions of various embodiments of the present disclosure are provided with reference to nitrogen VCs (NVCs), a particular class of VC-based spin qubits where a substitutional atom of a VC is nitrogen, at least some teachings of the present disclosure may be applicable to quantum circuits implementing VC-based spin qubits with substitutional atoms other than nitrogen, e.g. silicon VCs (SiVCs), which may be integrated on a semiconductor substrate as described herein, all of which being within the scope of the present disclosure. Furthermore, the quantum circuit assemblies described herein may implement different types of qubits at the same time, e.g. hybrid semiconducting-superconducting quantum circuits may implement VC-based spin qubits in combination with superconducting qubits.

Spin qubit device assemblies with VC-based spin qubits integrated on a semiconductor substrate according to any of the methods described herein may be implemented in one or more components associated with an integrated circuit (IC) or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. The accompanying drawings are not necessarily drawn to scale. For convenience, if a collection of drawings designated with different letters are present, e.g. FIGS. 6A-6E, such a collection may be referred to herein without the letters, e.g. as "FIG. 6."

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Various aspects of the illustrative implementations may be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−20% of a target value based on the context of particular values as described herein or as known in the art. Furthermore, as used herein, terms indicating what may be considered an idealized behavior, such as e.g. "superconducting" or "lossless", are intended to cover functionality that may not be exactly ideal but is within acceptable margins for a given application.

Still further, while the present disclosure may include references to microwave signals, this is done only because current qubits are designed to work with such signals because the energy in the microwave range is higher than thermal excitations at the temperature that qubits are typically operated at. In addition, techniques for the control and measurement of microwaves are well known. For these reasons, typical frequencies of qubits are in 1-10 GHz, e.g. in 5-10 GHz, range, in order to be higher than thermal excitations, but low enough for ease of microwave engineering. However, advantageously, because excitation energy of qubits may be controlled by the circuit elements, qubits could be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

VC-Based Spin Qubit Devices

In order to highlight the advantages offered by novel VC-based spin qubit devices described herein, it would be helpful to first describe various implementations of quantum circuits with VC-based spin qubits that could be included in a qubit die. FIG. 1 provides a schematic illustration of an exemplary VC-based spin qubit device 100, according to some embodiments of the present disclosure.

As shown in FIG. 1, an exemplary VC-based spin qubit device 100 may include two or more VC-based spin qubits 102, where reference numerals following after a dash, such as e.g. qubit 102-1 and 102-2 indicate different instances of the same or analogous element. Each of the VC-based spin qubits 102 may include a VC island 104, where a VC island refers to a portion of a lattice of a carbon-based insulating material, e.g. diamond, in which portion a defect center is formed by substituting one carbon atom with one substitutional atom situated next to a vacant carbon lattice site. For example, when the substitutional atom is a nitrogen atom, then a VC is an NVC. Typically, a given VC-based spin qubit 102 contains one and only one VC island 104, and the VC island 104 within a given qubit 102 contains one and only one VC.

VC islands are integral building blocks in VC-based spin qubits where they form the basis of quantum circuit elements that can approximate functionality of theoretically designed qubits. A VC forms a triplet, i.e. a quantum state of a system with a spin of quantum numbers s=1, such that there are three allowed values of the spin component (i.e. three allowed spin states), $m_s=0$ (referred to as a spin state "$m_{s0}$"), $m_s=1$ (referred to as a spin state "$m_{s1}$"), and $m_s=-1$ (referred to as a spin state "$m_{s-1}$"). The particular spin state of a VC at a given moment can be determined by optical excitation, i.e. by shining light onto the VC. Namely, the energy level structure of VCs is such that, when excited by light, VCs relax to emit photons having energies which depend on their spin state before the excitation, which allows using the energy of the emitted photons to deduce the spin state before excitation and enables optical readout of spin qubits incorporating VCs. Optical excitation can also be used to control the spin state of a VC, which enables initialization of VC-based spin qubits. In particular, repeatedly exciting a VC and allowing it to relax, a process known as "cycling", results in that VC adapting a particular spin state (or, at least results in an increased probability that that VC will adapt a particular spin state), e.g. a spin state $m_{s0}$, which process may be used to optically initialize a VC-based spin qubit.

As also shown in FIG. 1, the VC-based spin qubit device 100 may further include a plurality of resonators 106, a plurality of waveguides 108, a plurality of electrodes 110, and one or more radio frequency (RF) lines 112.

Each VC island 104 typically has one of the resonators 106 and one of the waveguides 108 associated with it (i.e. there is a corresponding waveguide and a resonator for each VC island). In general, a VC of a given VC island 104 may couple to its associated resonator 106, the photons may couple from the resonator 106 to the waveguide 108 associated with the VC island. Further, two waveguides 108 may couple to one another to create a beam splitter to entangle photons and thereby entangle different VCs (i.e. VCs from different VC islands 104). A waveguide 108 may include any structure suitable for supporting propagation of optical waves of an appropriate wavelength, e.g. of zero-phonon-line (ZPL) NVC emission having a wavelength of about 637 nanometers.

In some embodiments, the waveguide 108 may include diamond or a material that includes gallium and phosphorous, e.g. gallium phosphide (GaP). A waveguide 108 associated with a given VC island 104 may be provided at a distance between about 10 to 200 nanometers from the resonator 106 associated with the island, including all values and ranges therein, e.g. between about 25 to 175 nanometers or between about 50 to 150 nanometers.

Similarly, the resonator 106 corresponding to a given VC island 104 may also be provided in the vicinity of the VC island 104 so that the photons emitted by a VC of the island can be efficiently collected by the associated resonator 106 and photon emission into the ZPL can be enhanced by the Purcell effect. The resonator may be made of a material having about the same or a higher index of refraction compared to diamond, e.g. diamond or GaP. The resonator 106 may be configured to collect the photons from the VC of its associated VC island 104 and enhance emission of photons at the resonance wavelength into the resonator by the Purcell effect. In some embodiments, at least a portion of the resonator 106 associated with a particular VC island 104 may be provided over (i.e. above) at least a portion of the VC island in order to couple photons between the VC island 104 and the resonator 106. To that end, in some embodiments it may be particularly advantageous to have the VC island 104 at or close to an edge of the associated resonator 106 because most of the mode volume of the standing wave in the resonator 106 is at the edges of the resonator 106. For example, in some embodiments, an end portion of a resonator 106 associated with a particular VC island 104 may overlap with a portion of the associated VC island 104 by between about 20 and 100 nanometers, including all values and ranges therein. In various embodiments, a cross-sectional dimension, e.g. a diameter, of a resonator 106 may be between about 100 and 2500 nanometers, including all values and ranges therein, e.g. between about 150 and 1000 nanometers or between about 200 and 500 nanometers, and, in the case of a ring resonator, the width of the resonator may be between 20 and 300 nm, including all values and ranges therein, e.g. between about 50 and 230 nanometers or between about 70 and 200 nanometers.

At some point in the quantum circuit, a waveguide 108 associated with a VC island 104 of a first qubit 102-1 may be routed to be in proximity to a waveguide 108 associated with a VC island 104 of a second qubit 102-2, in order to couple, or entangle, the two qubits 102. To that end, at least a portion of the first waveguide 108 may be at a distance from at least a portion of the second waveguide 108 that allows optical modes within the two waveguides to overlap, such portions of the first and second waveguides 108 forming a beam splitter. In some embodiments, such a distance may be e.g. between 10 and 200 nanometers from at least a portion of the second waveguide 108, including all values and ranges therein, e.g. at a distance between 50 and 100 nanometers. In some embodiments, at least one portion of a waveguide 108 may be coupled to a detector for detecting and counting photons within the waveguide in order to infer the spin state of the associated spin qubit 102.

The electrodes 110 include, at the minimum, a pair of electrodes per VC island 104, disposed in the vicinity of the VC island and configured to Stark tune the resonance frequency of the VC. Optionally, the electrodes 110 may further include a second set of electrodes per VC island 104 configured to tune the resonance wavelength of the associated resonator 106, in implementations when the resonator 106 is made from an electro-optic material, i.e. a material in which index of refraction changes depending on the applied electric field, such as gallium phosphide. Tuning the resonant frequency of the VC allows coupling and decoupling different VCs to/from one another, and coupling and decoupling a given VC island 104 and an associated resonator 106. Tuning the resonant frequency of the resonator 106 provides another level of control for coupling and decoupling the resonator 106 from the associated VC island 104. In some implementations, it may also be used to compensate for manufacturing variations in order to bring the resonator 106 to the desired resonant frequency at which it was designed to operate.

The RF line 112 may be used to manipulate the qubit state, i.e. modulate between the $m_s=0$ and $m_s=\pm 1$ states.

The qubits 102, the resonators 106, the waveguides 108, the electrodes 110, and the RF lines 112 VC-based spin qubit device 100 may be provided on, over, or at least partially embedded in a semiconductor substrate/die (not shown in FIG. 1), where the VC islands 104 may be integrated on the semiconductor substrate using either the self-assembly method or the buffer-based method described herein. The substrate may be any substrate suitable for realizing quantum circuit assemblies described herein. In particular, the substrate may be a crystalline semiconductor substrate such as, but not limited to a silicon substrate or a III-V substrate, and may be provided as a wafer or a portion thereof. In other implementations, the substrate may be a non-crystalline semiconductor substrate.

In various embodiments, quantum circuits such as the one shown in FIG. 1 may be used to implement components associated with a quantum IC. Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the IC. The IC may be employed as part of a chipset for executing one or more related functions in a quantum system.

Integrating VC Islands on Semiconductor Substrates

In various embodiments, the VC islands of a spin qubit device, such as e.g. the one shown in FIG. 1, may be integrated on the semiconductor substrate using either the self-assembly method or the buffer-based method described herein. FIGS. 2A-2C illustrate exemplary layout designs of VC islands integrated on a semiconductor substrate, according to various embodiments of the present disclosure. In particular, FIG. 2A illustrates a spin qubit device assembly 200A which may be a result of using the self-assembly method described herein, while FIGS. 2B and 2C illustrate spin qubit device assemblies 200B and 200C, respectively, each of which may be a result of using the buffer-based method described herein.

Turning to FIG. 2A, the spin qubit device assembly 200A illustrates a semiconductor substrate 202, e.g. a silicon substrate, and two VC islands shown as a first VC island 204-1 and a second VC island 204-2. The VC islands 204 shown in FIG. 2A may be examples of the VC islands 104 and may be included in a spin qubit device such as the one shown in FIG. 1. As shown in FIG. 2A, the VC islands 204 of the spin qubit device assembly 200A are integrated on the semiconductor substrate 202 by having at least a portion of each VC island 204 being surrounded by the semiconductor material of the substrate 202. In some embodiments, the semiconductor material of the substrate 202 may be in contact with the diamond material of the VC islands 204. In other embodiments, although not specifically shown in FIG. 2A, there may be one or more intermediate layers of other materials at the interface between the semiconductor material of the substrate 202 and the diamond material of the VC islands 204, such as e.g. a residue layer left over from the functionalization of inside surfaces of the openings in the substrate 202 to promote attachment of the VC islands 204 to the desired locations, as described in greater detail below. In some embodiments, such a residue layer may include one or more of hydroxy (—OH), oxygen (—O), hydrogen (—H), or nitrogen (—N) group terminations, all of which are examples of residues which may be left over as a result of using surface functionalization, and may have a thickness between about 0.1 and 5 nanometers, including all values and ranges therein, e.g. between about 0.1 and 1 nanometers or between about 0.1 and 0.5 nanometers.

Turning to FIGS. 2B and 2C, similar to FIG. 2A, each of the spin qubit device assemblies 200B and 200C illustrates the semiconductor substrate 202 and two exemplary VC islands 204-1 and 204-2. Also similar to FIG. 2A, the VC islands 204 shown in FIGS. 2B and 2C may be examples of the VC islands 104 and may be included in a spin qubit device such as the one shown in FIG. 1. What is different from FIG. 2A is that in the assemblies shown in FIGS. 2B and 2C the VC islands 204 are integrated on the semiconductor substrate 202 by being provided over a buffer layer 208 of a III-N material grown over the semiconductor substrate 202. In particular, the assembly 200B shown in FIG. 2B illustrates an embodiment where the VC islands 204 are provided within openings in the buffer layer 208 itself, while the assembly 200C shown in FIG. 2C illustrates an embodiment where the VC islands 204 are provided within openings in a further layer 210 of a carbon-based insulating material, e.g. diamond, provided over the buffer layer 208. For the assembly 200B, the VC islands 204 may be provided in the uppermost layer of the III-N material of the buffer layer 208, i.e. at least portions of the VC islands 204 may be surrounded by the III-N material of the buffer layer, and may extend into the III-N material to a depth between about 20 nm and 1000 nm, including all values and ranges therein, e.g. between about 40 and 200 nm, or between about 50 and 100 nm.

The buffer-based method of integrating the VC islands as described herein is based on recognition that a typical semiconductor substrate, e.g. Si or Ge substrate, would have a significant lattice mismatch with an insulating carbon-based material such as diamond in which VCs can be formed and, therefore, trying to grow such a material directly on the substrate would not work as there would be too many defects caused by the mismatch. For example, a lattice mismatch may be as large as about 15-17% or even larger. On the other hand, III-N materials have a lattice constant which is quite similar to that of diamond, with a lattice mismatch being less than about 10%. The buffer-based method described herein takes advantage of this fact by, first, growing the buffer layer 208 with the intention that most of the defects would be trapped in it, and then growing the insulating carbon-based material in openings either within the buffer layer 208 and providing VCs therein (as shown in FIG. 2B) or growing the insulating carbon-based material as a continuous layer over the buffer layer and providing VCs where spin qubits are to be formed (as shown in FIG. 2C).

In order to minimize the amount of defects in the buffer layer 208, its' growth may be carried out in a manner that would impede vertical growth of the III-N material seeded directly from the substrate 202 and, instead, lateral growth of the III-N material is encouraged, a process known as "lateral epitaxial overgrowth" (LEO) (also known as "epitaxial lateral overgrowth" (ELO)). To that end, structures which would block seeding of the III-N material from the substrate 202 may be provided over the substrate 202 prior to growth of the buffer layer 208, which structures are shown in FIGS. 2B and 2C as exemplary seed-blocking structures 206. Ensuring that at least a part of the III-N material of the buffer layer 208 is formed by LEO, as opposed to purely vertical growth, allows improving quality of the III-N semiconductor material without having to grow a thick III-N layer in order to achieve such quality.

In various embodiments, the buffer layer 208 shown in FIGS. 2B and 2C may have a thickness between about 500 and 5000 nanometers, including all values and ranges therein, e.g. between about 1000 and 2000 nanometers. A lattice constant of the semiconductor substrate 202 may be different from a lattice constant of the III-N material of the buffer layer 208 by at least about 15%, e.g. at least about 17%, or at least about 20%.

The seed-blocking structures 206 may include one or more structures of a dielectric material on the semiconductor substrate 202, where portions of the III-N material of the buffer layer 208 enclose the one or more structures. For example, portions of the buffer layer 208 may enclose the one or more structures 206 substantially on all sides except where the structures interface (i.e. in contact with, possibly with any of the interfacial layers formed as a result of bringing two materials in contact with one another) the substrate 202. As illustrated with FIGS. 2B and 2C, such structures may remain in the device assemblies 200B and 200C as a result of using the seed-blocking elements as described herein (i.e. these structures may be the seed-blocking elements as described herein). In various embodiments, the dielectric material of the seed-blocking structures 206 may include one or more of a compound including silicon and oxygen (e.g., SiO2), and a compound including hafnium and oxygen (e.g., HfO2).

The different views of the qubit device assemblies as described herein are shown in the FIGS. with precise right angles and straight lines, which does not reflect example real world process limitations which may cause the features to not look so ideal when any of the structures described above are examined using e.g. scanning electron microscopy (SEM) images or transmission electron microscope (TEM) images. In such images of real structures, possible processing defects could also be visible, such as e.g. tapered vias, occasional screw, edge, or combination dislocations within the crystalline region, occasional dislocation defects of single atoms or clusters of atoms.

Further details of the assemblies shown in FIGS. 2A-2C will be provided in the description of the respective methods which may be used to form such assemblies, provided below.

Self-Assembly Method for Integrating VC Islands on a Semiconductor Substrate

FIG. 3 provides a flow diagram of a self-assembly method 300 for integrating VC islands for VC-based spin qubits on a semiconductor substrate, according to some embodiments of the present disclosure. For example, the method 300 may be used to integrate the VC islands 204 on the substrate 202, as shown in FIG. 2A, as a part of fabricating a VC-based spin qubit device such as the spin qubit device 100 shown in FIG. 1.

Although the operations of the method 300 are illustrated once each and in a particular order, the operations may be performed in any suitable order and repeated as desired. For example, one or more operations may be performed in parallel to manufacture multiple spin qubit devices with VC-based spin qubits substantially simultaneously. In another example, the operations may be performed in a different order to reflect the structure of a spin qubit device in which VC islands integrated on a semiconductor substrate as described herein will be included. In addition, the manufacturing method 300 may include other operations, not specifically shown in FIG. 3, such as e.g. various cleaning operations as known in the art. For example, in some embodiments, the spin qubit device assembly, or various portions thereof, may be cleaned prior to, during, or/and after any of the processes of the method 300 described herein, e.g. to remove surface-bound organic and metallic contaminants, as well as subsurface contamination. In some embodiments, cleaning may be carried out using e.g. a chemical solutions (such as peroxide), and/or with ultraviolet (UV) radiation combined with ozone, and/or oxidizing the surface (e.g., using thermal oxidation) then removing the oxide (e.g. using hydrofluoric acid (HF)). In another example, the method 300 may further include other manufacturing operations related to fabrication of other components of a VC-based spin qubit device, also not specifically shown in FIG. 3, such as e.g. manufacturing operations for fabricating any one or more of the waveguides, resonators, and RF lines, e.g. to fabricate a spin qubit device as e.g. shown in FIG. 1.

FIGS. 4A-4E are various views illustrating different exemplary stages in the manufacture of a spin qubit device assembly using the self-assembly method of FIG. 3, in accordance with some embodiments of the present disclosure. A number of elements referred to in the description of FIG. 3 and FIGS. 4A-4E with reference numerals are indicated in FIGS. 4A-4E with different patterns, with a legend showing the correspondence between the reference numerals and patterns being provided at the bottom of FIGS. 4A-4E, and are not labeled in FIGS. 4A-4E with arrows pointing to them in order to not clutter the drawings. For example, the legend illustrates that FIGS. 4A-4E use different patterns to show the substrate 202, the VC islands 204, etc.

Turning to the method 300, the method may begin with a process 302 during which openings are formed in a semiconductor substrate, the openings intended to later house portions of the VC islands. A result of performing the process 302 is illustrated with a spin qubit device assembly 402 shown in FIG. 4A. The assembly 402 illustrates two exemplary openings 432, each of which can later serve as a location where a VC island of a different spin qubit will be placed, e.g. the VC islands for forming two qubits 102/202 as described above. Locations of the openings 432 would, therefore, be the ones where the VC islands of the future qubits should be on a qubit die. In some embodiments, a transverse dimension at the top of the opening 432, illustrated in FIG. 4A as a width 434, may be less than about 200 nanometers, including all values and ranges therein, e.g. less than about 100 nanometers. A cross-section of the opening 432 from the top (i.e. in the plane perpendicular to the plane of the drawing) may have any suitable form, such as, but not limited to, a circle, a square, any other polygonal shape besides the square, or any other shape with curves which is not necessarily a circle. An area of a surface of the substrate 202 removed to form the opening 432 may be between about 100 and 40000 square nanometers, including all values and ranges therein, e.g. between 1000 and 10000 square nanometers. A depth of the opening, i.e. a dimension illustrated in FIG. 4A as a depth 436, may be between about 20 and 1000 nanometers, including all values and ranges therein, e.g. between about 40 and 200 nanometers, or between about 50 and 100 nanometers. A pitch of adjacent openings 432 (e.g. measured as a center-to-center distance between two adjacent openings, illustrated in FIG. 4A as a pitch 438) may be between about 100 and 10000 nanometers, including all values and ranges therein, e.g. between about 500 and 2000 nanometers.

Figure 4A:
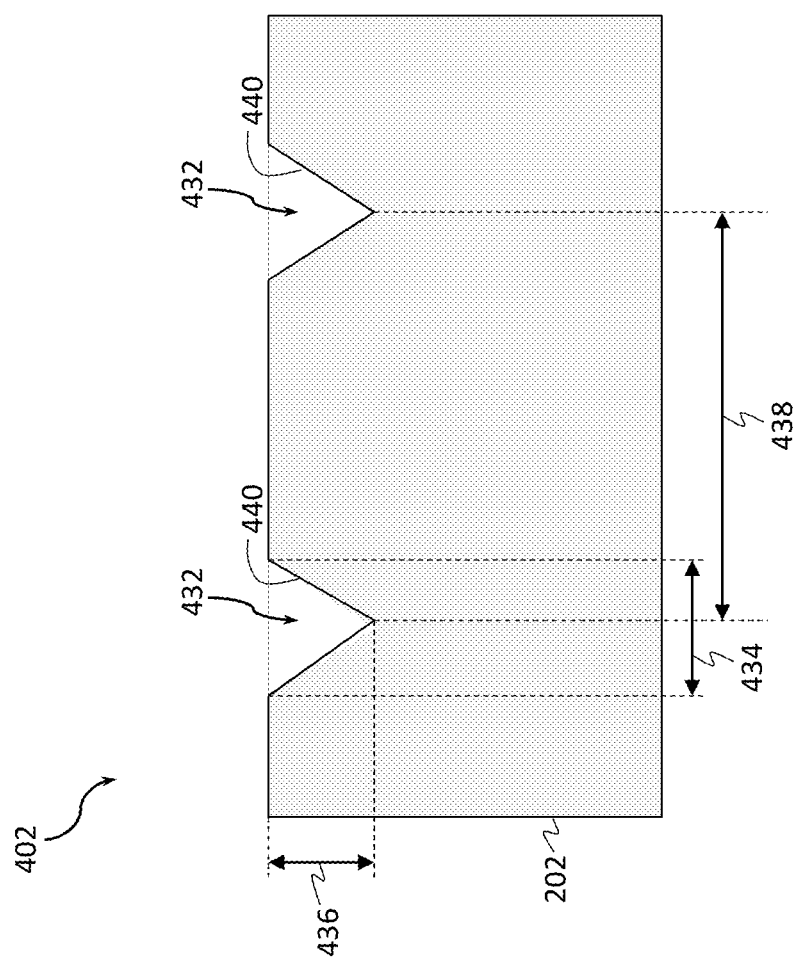
Figure 4B:
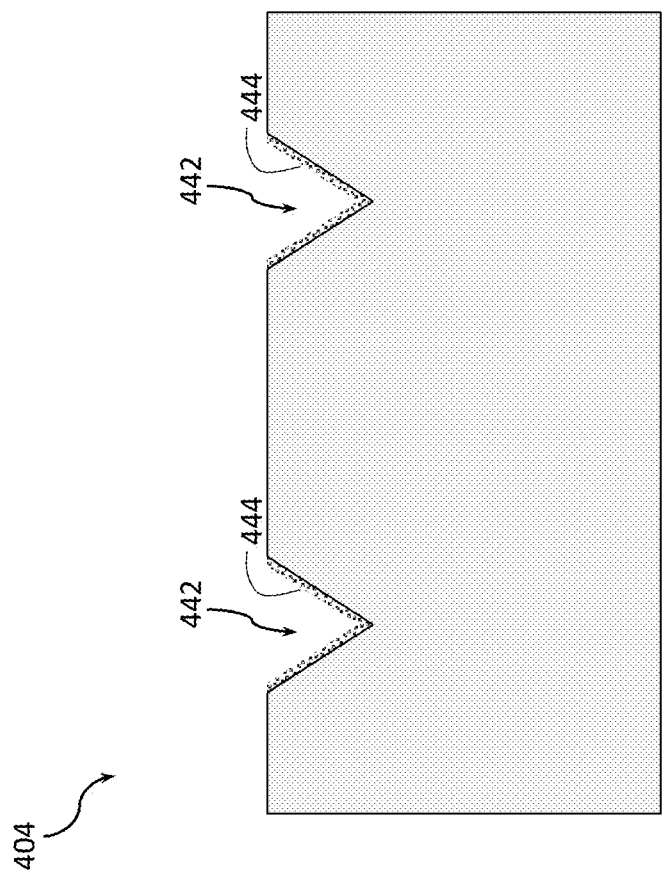

As shown in FIG. 4A, the openings 432 have a shape so that the width of the opening at the surface of the substrate 202 is larger than the width of the opening deeper inside the substrate 202, i.e. the openings 432 have a so-called "non-re-entrant" profile where a width closer to the top of an opening is larger than a width closer to the bottom of the opening. Having such a shape can help ensure that VC islands which will later be distributed over the substrate in a solution or a suspension will fit into the openings 432 in the way they are supposed to fit. In the example shown in FIG. 4A and other figures. illustrating the self-assembly method, the openings 432 are shown to have a substantially conical shape (i.e. has a three-dimensional geometric shape that tapers smoothly from a base closer to the uppermost surface of the substrate 202, which base may be either substantially flat or curved, to a point called the apex or vertex which is the farthest away from the uppermost surface of the substrate compared to other points of the opening 432), ending with an apex at the bottom of the opening. However, in other embodiments, the openings 432 may have any other suitable shapes having a non-re-entrant profile, such as e.g. a substantially truncated cone shape (i.e. a shape similar to the conical shape except that the portion of the shape closes to the apex is truncated along a plane parallel to the base, substantially forming a conical frustum).

In various embodiments, the openings 432 may be formed in the process 302 using any suitable patterning technique, where, as used herein, "patterning" may refer to forming a pattern in one or more materials using any suitable techniques (e.g., applying a resist, patterning the resist using lithography, and then etching the one or more material using dry etching, wet etching, or any appropriate technique). Examples of patterning techniques include photolithographic or electron-beam (e-beam) or optical patterning, possibly in conjunction with a dry etch, such as e.g. RF reactive ion etch (RIE) or inductively coupled plasma (ICP) RIE, or any other suitable etch technique to pattern a given material into a structure of a specified geometry for a given implementation, e.g. to pattern the substrate 202 to form the openings 432 as described herein.

FIG. 4A further illustrates inner sidewalls 440 of the openings 432.

Once the openings 432 are formed, the method 300 may proceed with an optional process 304 where the inner sidewalls 440 of the openings 432 may be lined with a layer of a functionalization material that may enable or promote attachment of the VC islands to the sidewalls of the openings in a later process of the method 300. A result of performing the process 304 is illustrated with a spin qubit device assembly 404 shown in FIG. 4B. The assembly 404 the example of the assembly 402 shown in FIG. 4A, where the openings 432 have become openings 442 because their volume is reduced somewhat as a result of depositing the layer 444. A thickness of the layer 444 may be between about 0.1 and 5 nanometers, including all values and ranges therein, and the volume of the openings 432 may decrease correspondingly to the thickness of the layer 444. In various embodiments, the functionalization material 444 may be any suitable material that would enable or promote attachment of the VC islands thereon, and may include one or more of —OH or —O or —H or —N groups. In various embodiments, the layer 444 may be deposited in the process 304 using any suitable deposition technique, such as spin-coating, dip-coating, atomic layer deposition (ALD) or chemical vapor deposition (CVD), possibly in combination with patterning.

Although not specifically shown in the FIGS., instead of depositing a layer of a functionalization material defining the areas where the VC islands are to be attached at a later process, the process 304 could involve depositing a layer of a protection or a passivation material defining the complementary areas where the VC islands are not to be attached. For example, such a material could be deposited on the upper surface of the substrate 202 and not on the inner sidewalls 440 of the openings 432. If the material is a passivation material, then it could actively inhibit, reduce or prevent attachment of the VC islands to that surface, ensuring that the VC islands are attached to the inner sidewalls 440 of the openings 432. If the material is a protection material, such as e.g. a suitable oxide, e.g. silicon oxide, then it could serve to protect the surface of the structure from having VC islands attached thereto because, once the VC islands are placed in the desired locations, the protection material layer may be removed, thereby removing any VC islands attached to it. In various embodiments, such protection or passivation materials could be deposited in the process 304 using any suitable deposition technique, such as spin-coating, dip-coating, ALD or CVD, possibly in combination with patterning.

Turning back to FIG. 3, as shown, the method 300 may also include a process 306 which includes forming diamond or VC islands which will be provided into the openings 432 or 442 in a later process 308. Although shown in FIG. 3 to follow the process 304, in various embodiments, the process 306 may be carried out any time before, after, or overlapping with any of the processes 302 and 304. Furthermore, the processes 306 and 308 shown in FIG. 3 refer to "diamond/VC islands" to indicate that they may refer to either diamond islands or VC islands, where diamond islands are islands as the VC islands except that they do not yet include a defect which makes an island a VC island. Such defects may be introduced later, after islands have been placed into the openings 432/442.

Figure 4C:
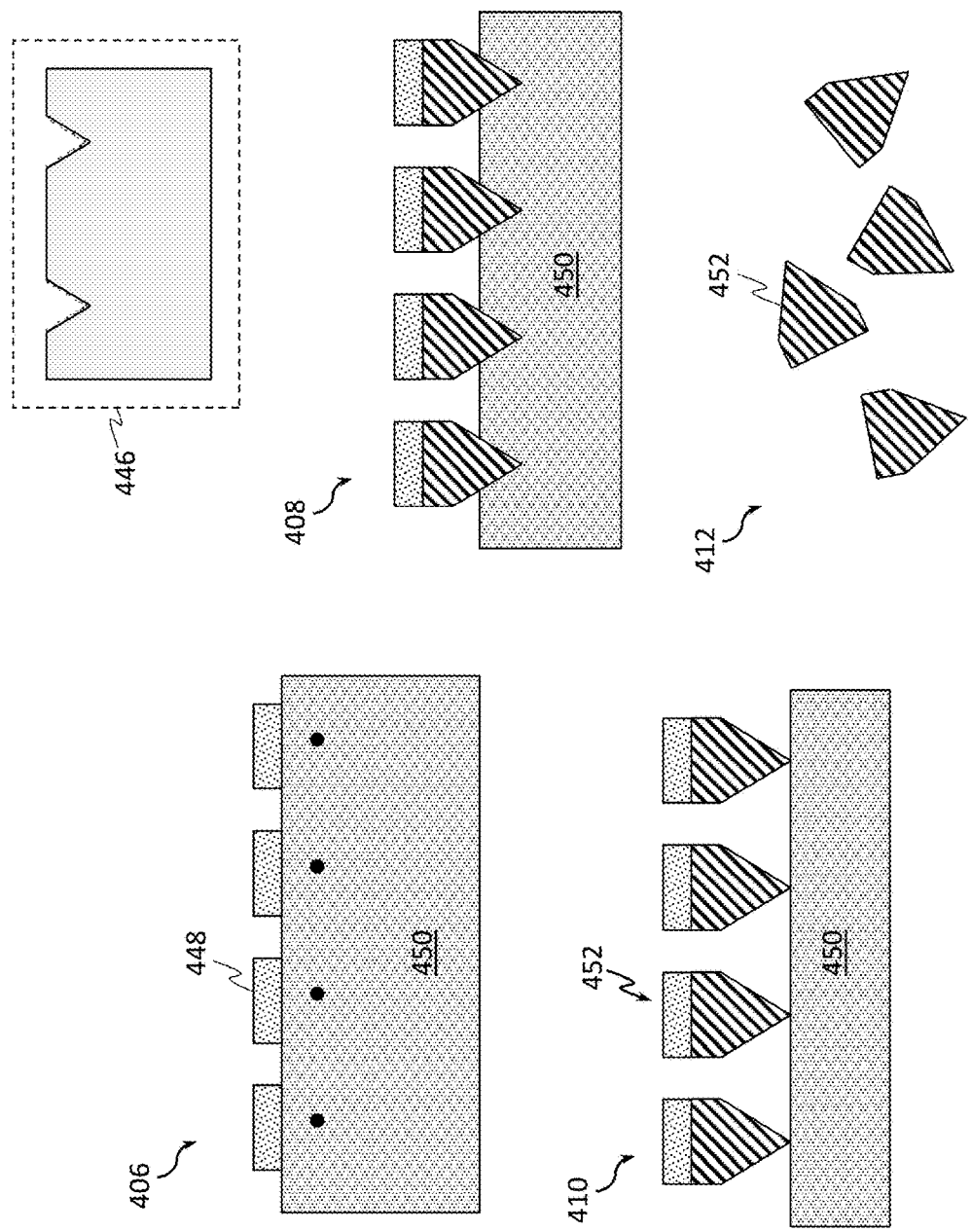
Figure 4E:
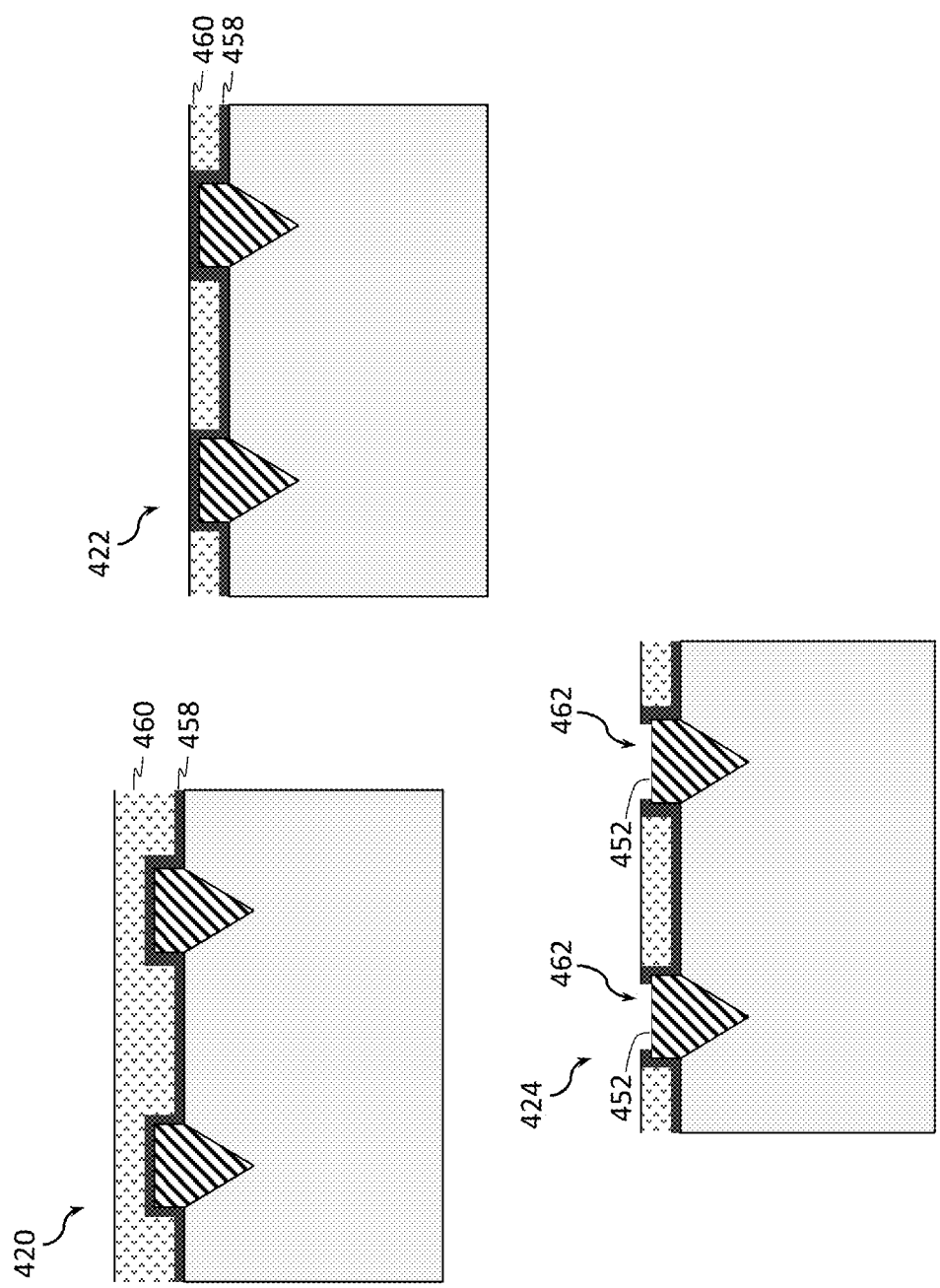

The process 306 includes multiple processes within, as illustrates with assemblies 406, 408, 410, and 412 shown in FIG. 4C, each of which illustrating examples of VC islands being formed. In other embodiments, analogous steps may be carried out on a carbon-based insulating material such as diamond without the VC defects. An inset 446 shown in FIG. 4C illustrates that as the diamond/VC islands are being fabricated, the assembly with the substrate, shown in the inset 446 as the assembly 404 of FIG. 4B, may be temporarily set aside. The assembly 406 shown in FIG. 4C illustrates that the process 306 may begin with providing islands of a photoresist or any other mask material 448, over a structure of diamond 450 (or other insulating carbon-based material suitable for forming VC islands), the photoresist or other mask material 448 being suitable for defining locations where diamond/VC islands are to be formed. A black dot illustrates in the diamond 450 schematically illustrates a defect that forms a VC, showing that, in the assembly 406, the photoresist/mask element 448 is provided over a corresponding defect, so that VC islands with one defect per island can later be created.

The assembly 408 illustrates that, next, an etching process is started to remove material of the diamond 450 that is not covered by the photoresist/mask 448. To that end, the photoresist/mask 448 should be selected as any material having sufficient etch selectivity with respect to the diamond 450, i.e. any material which would not be substantially etched when etchants which can etch the diamond 450 are used, and vice versa. In particular, an isotropic etch (i.e. an etch process which etches the diamond 450 in multiple directions) may be used in order to create an undercut which would eventually release the diamond/VC islands from the rest of the structure of the diamond 450. The assembly 410 illustrates that at some points diamond/VC islands 452 are formed (only one is labeled in FIG. 4C, but four as shown as an example), which are eventually released, due to the undercut, from the rest of the diamond 450 and are free, as shown with the assembly 412 in FIG. 4C. The diamond/VC islands 452 may then be included in a solution or a suspension, e.g. using isopropyl alcohol or similar as a liquid medium.

The method 300 may then proceed with a process 308, where the diamond/VC islands distributed in a solution or a suspension are provided into the openings 432 or 442. In some embodiments, the process 308 may also include multiple processes, as shown e.g. in FIG. 4D with assemblies 414, 416, and 418. The assembly 414 illustrates an the embodiment where the layer 444 of a functionalization material is not used, showing that the solution/suspension with the diamond/VC islands 452 is being brought near the assembly 402, e.g. using spin-coating, dip-coating, or any other suitable process. As a result of that, some of the diamond/VC islands 452 will end up within the openings 432, as shown with the assembly 416 illustrating that two of the four diamond/VC islands 452 ended up within the openings 432, while the remaining diamond/VC islands 452 are somewhere on the surface of the semiconductor substrate 202. The process 308 may conclude with an optional process where excess diamond/VC islands 452, i.e. the ones which did not fit into the openings 432, are removed, an exemplary result of which is shown with the assembly 418. It should be noted that, although the photoresist 448 is shown to be removed from the diamond/VC islands 452 already in the assembly 412 in FIG. 4C, in other embodiments, it may be removed at any later point, e.g. once the diamond/VC islands 452 have been put in place in the assembly 418. In addition, in some embodiments, the VC islands may be created once the diamond islands 452 have been put in place on the assembly 418 and the photoresist 448 has been removed.

As shown in the assembly 418, as a result of performing the process 308, the diamond/VC islands 452 are integrated in the uppermost portion/layer 454 of the semiconductor substrate 202, where at least a portion of the diamond/VC island 452, shown in the assembly 418 as a portion 456 for each island 452, identified with a dotted contour, is surrounded by the semiconductor material of the substrate 202. In order to allow such integration, the shape and dimensions of the islands 452 should be substantially similar to the shape and dimensions of the openings in which they are inserted, i.e. the openings 432 or 442, depending on whether the functionalization material 444 is used. The various dimensions for the openings 432 described above are, therefore, applicable to the dimensions of the diamond/VC islands 452, which descriptions are not repeated here.

The method 300 may also, optionally, include a process 310 that involves providing further layers and creating necessary openings over the VC islands placed into the openings 432/442. In some embodiments, the process 310 may also include multiple processes, as shown e.g. in FIG. 4E with assemblies 420, 422, and 424. The assembly 420 illustrates an embodiment where a hardmask 458 is placed over the upper surface of the assembly 418, and then a planarization material 460 is deposited over the hardmask 458. The hardmask 458 may include any material suitable to withstand the planarization process, e.g. silicon nitride, and the planarization material 460 may include any suitable optically transparent insulating material, such as e.g. silicon oxide. The assembly 422 illustrates that the planarization material 460 may then be planarized until upper surfaces of the hardmask 458 are exposed, which may e.g. be done using chemical mechanical polishing (CMP) to remove excess portions of the planarization material 460 as known in the art. Next, openings 462 may be formed exposing at least portions of the upper surfaces of the VC islands 452, as shown with the assembly 424. In some embodiments, the VCs may first be created after the assembly 424 is formed, i.e. the islands 452 until that point in time may be diamond islands without any defects.

Quantum circuit assemblies shown in FIGS. 4A-4E can vary significantly to achieve equivalent or similar results, and, therefore, should not be construed as the only possible implementations of quantum circuit assemblies in accordance with the self-assembly method for integrating VC islands on a semiconductor substrate described herein. In particular, spin qubit device assemblies shown in FIGS. 4A-4E should not be construed as the only possible implementations of quantum circuit assemblies where one or more VC islands are placed into openings in a semiconductor substrate in accordance with the self-assembly method described herein. There are many variations which could be implemented in context of the self-assembly method 300 described above, compared to what is shown in FIGS. 4A-4E, only some of which have been described above. First of all, as described above, the time at which the diamond 450 (or, more generally, any suitable carbon-based material from which islands with defect centers may be formed) is processed to create the VCs may vary considerably where the VCs may be formed as early as before the etching shown first with the assembly 408 begins or as late as after the openings 462 have been created over the islands 454 placed within the openings 432 or 442 (depending on whether or not the functionalization material 444 was used). Second, as described above, the shape of the openings 432 may vary considerably, as long as, preferably, the shape remains to have a non-re-entrant profile which would be useful in guiding placement of the diamond/VC islands into the openings. Correspondingly, the diamond/VC islands 452 formed in the process 306 should have shapes suitable for being placed into the openings 432/442. Although FIGS. 4A-4E illustrate the islands 452 as having substantially flat upper surface ("upper" once the diamonds are placed into the openings), in other embodiments, such a surface may have a convex shape, which may be helpful for coupling light into the VCs in these islands. Furthermore, although FIGS. 4A-4E illustrate the islands 452 as having portions which do not fit into the openings, e.g. as can be seen with portions of the islands 452 above the portions 456 in the assembly 418, above the surface of the substrate 202, in some embodiments, the islands 452 may fit into the openings in the substrate 202 in their entirety, and be flush with the surface of the substrate 202. In such embodiments, the process 310 shown in FIG. 3 may not be necessary. Further, although not specifically shown in FIG. 4A-4E, the method 300 may also include a process in which at least portions of at least some of the electrodes 110, described above, are formed. In particular, in some embodiments, portions of the electrodes 110 used for tuning the frequency of the VCs may be placed on the inner sidewalls 440 of the openings in the substrate 202, i.e. before the islands 452 are placed in the openings. In various embodiments, the electrodes 110 may be provided in a process in which one or more electrically conductive materials are deposited over the substrate 202, possibly in combination with patterning. Examples of deposition techniques for depositing electrode material(s) include ALD, CVD, physical vapor deposition (PVD) (e.g. evaporative deposition, magnetron sputtering, or e-beam deposition), or electroplating.

Buffer-Based Method for Integrating VC Islands on a Semiconductor Substrate

Figure 5:
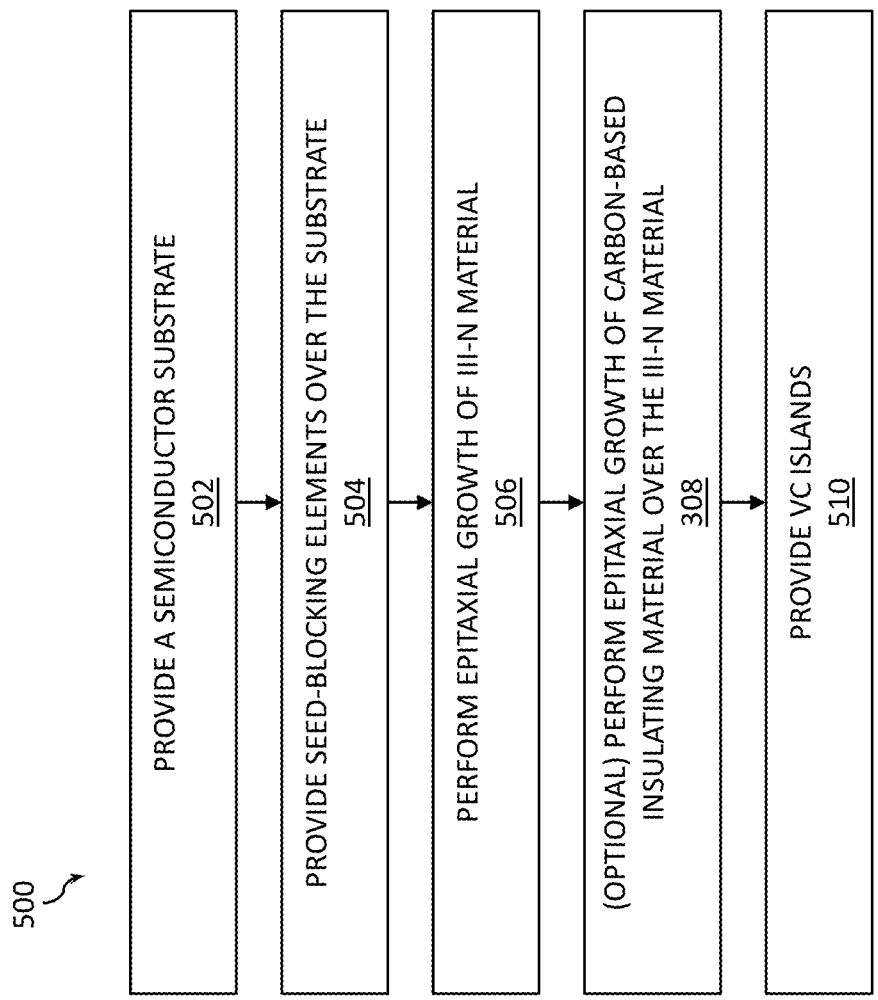
FIG. 5 provides a flow chart of a buffer-based method for integrating VC islands for VC-based spin qubits on a semiconductor substrate, according to some embodiments of the present disclosure.

FIG. 5 provides a flow diagram of a buffer-based method 500 for integrating VC islands for VC-based spin qubits on a semiconductor substrate, according to some embodiments of the present disclosure. For example, the method 500 may be used to integrate the VC islands 204 on the substrate 202, as shown in either FIG. 2B or FIG. 2C, as a part of fabricating a VC-based spin qubit device such as the spin qubit device 100 shown in FIG. 1.

Although the operations of the method 500 are illustrated once each and in a particular order, the operations may be performed in any suitable order and repeated as desired. For example, one or more operations may be performed in parallel to manufacture multiple spin qubit devices with VC-based spin qubits substantially simultaneously. In another example, the operations may be performed in a different order to reflect the structure of a spin qubit device in which VC islands integrated on a semiconductor substrate as described herein will be included. In addition, the manufacturing method 500 may include other operations, not specifically shown in FIG. 5, such as e.g. various cleaning operations as known in the art. For example, in some embodiments, the spin qubit device assembly, or various portions thereof, may be cleaned prior to, during, or/and after any of the processes of the method 500 described herein, e.g. to remove surface-bound organic and metallic contaminants, as well as subsurface contamination. In some embodiments, cleaning may be carried out as described above with reference to the method 300. In another example, the method 500 may further include other manufacturing operations related to fabrication of other components of a VC-based spin qubit device, also not specifically shown in FIG. 5, such as e.g. manufacturing operations for fabricating any one or more of the waveguides, resonators, and RF lines, e.g. to fabricate a spin qubit device as e.g. shown in FIG. 1.

FIGS. 6A-6E are various views illustrating different exemplary stages in the manufacture of a spin qubit device assembly using the buffer-based method of FIG. 5, in accordance with some embodiments of the present disclosure. A number of elements referred to in the description of FIG. 5 and FIGS. 6A-6E with reference numerals are indicated in FIGS. 6A-6E with different patterns, with a legend showing the correspondence between the reference numerals and patterns being provided at the bottom of FIGS. 6A-6E, and are not labeled in FIGS. 6A-6E with arrows pointing to them in order to not clutter the drawings. For example, the legend illustrates that FIGS. 6A-6E use different patterns to show the substrate 202, the VC islands 204, etc.

The method 500 may begin with a process 502 that includes providing a semiconductor substrate which will serve to house VC-based spin qubits as described herein. A result of performing the process 502 is illustrated with a spin qubit device assembly 602 shown in FIG. 6A where the substrate 202 as described above is provided.

The method 500 may then proceed with a process 504 during which seed-blocking elements are provided over the substrate provided in the process 502. A result of performing the process 504 is illustrated with a spin qubit device assembly 604 shown in FIG. 6B where four exemplary seed-blocking elements 206 are shown. In other embodiments, any other number of such elements 206 may be used, located in any suitable locations on the substrate 202 in accordance with the principles described herein.

The seed-blocking structures 206 may be formed from any dielectric material that can serve to prevent that the epitaxial growth of the III-N material in the subsequent fabrication process of the method 500 (process 306) is seeded from the substrate 202. In general, the dielectric material of the III-N growth blocking structures 206 may e.g. include any of the low-k or high-k dielectric materials as commonly used in semiconductor processing, including but not limited to elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used as the III-N growth blocking material may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. Examples of low-k materials that may be used as the III-N growth blocking material may include, but are not limited to, fluorine-doped silicon dioxide, carbon-doped silicon dioxide, spin-on organic polymeric dielectrics such as polyimide, polynorbornenes, benzocyclobutene, and polytetrafluoroethylene (PTFE), or spin-on silicon-based polymeric dielectric such as e.g. hydrogen silsesquioxane (HSQ) and methylsilsesquioxane (MSQ)).

In various embodiments, a thickness of the seed-blocking structures 206 provided in the process 504 may be between about 2 and 50 nm, e.g. between about 3 and 30 nm, or between about 5 and 10 nm. Any suitable deposition techniques may be used to provide the III-N seed-blocking structures 206, such as e.g. spin-coating, dip-coating, CVD, ALD, PECVD, thermal oxidation. In some embodiments, deposition of the material for the seed-blocking structures 206 in the process 504 may, optionally, be performed in combination with patterning, such as e.g. photolithographic or electron-beam patterning, to ensure that the seed-blocking layer is formed into structures 206 which are provided only over certain areas of the substrate 202, but not entire substrate. In general, the seed-blocking structures 206 provided in the process 504 may include one or more structures of a dielectric material on the semiconductor substrate 202, where portions of the III-N material of the buffer layer 208 grown at a later process 506 will enclose the structures 206. In some embodiments, a ratio of an area of the semiconductor substrate 202 that is in contact with the dielectric material of the seed-blocking structures 206 to an area of the semiconductor substrate 202 that is in contact with the III-N material of the buffer layer 208 may be at least about 1, e.g. at least about 1.5. The larger is this ratio, the more surface area of the substrate 202 is covered with the seed-blocking elements 206 which prevent vertical growth of the III-N material of the buffer layer 208, thus promoting lateral growth of III-N material by LEO and bending of defects. Some surface of the substrate 202 is to be left exposed, i.e. without the seed-blocking material provided thereon, to enable initiation of the epitaxial growth of a III-N semiconductor material from such exposed crystalline surface at the process 506, described below.

The method 500 may then proceed with a process 506 of epitaxially growing a III-N semiconductor material over the substrate 202 with the seed-blocking structures 206 formed in the process 504. An exemplary result of the process 506 is illustrated with a device assembly 606 shown in FIG. 6C showing a III-N semiconductor material forming the buffer layer 208.

The epitaxial growth of the process 506 may be performed by providing fluid precursors for the growth of the desired III-N semiconductor material, e.g. tri-methyl-aluminum (TMA), tri-ethyl-aluminum (TEA), nitrogen, ammonia, etc. The epitaxial growth will start from the surfaces of the substrate 202 that are not covered with the seed-blocking structures 206 because those will be the only crystalline surfaces and, therefore, the only places from which the epitaxial growth can be initiated. As precursors are continuously supplied into a reaction chamber into which the assembly 604 is places, the III-N semiconductor material will start growing upwards (i.e. in the vertical direction of the FIGS.) and then continue to grow in the lateral direction (i.e. in the horizontal direction of the FIGS.), over the III-N seed-blocking structures 206, by LEO. The crystalline quality of the resulting portions of the III-N semiconductor material that is grown by LEO is likely to be higher than that of the vertically grown portions. Approximately, the LEO portions of the III-N semiconductor material of the buffer layer 208 will be the portions over the III-N seed-blocking structures 206, while the vertically grown portions of the III-N semiconductor material of the buffer layer 208 will be the portions grown over the seed surfaces of the substrate 202 (i.e. grown over the spaces between the seed-blocking structures 206).

The method 500 may then proceed with an optional process 508 where an insulating carbon-based material is then grown over the buffer layer provided in the process 506. An exemplary result of the process 508 is illustrated with a device assembly 608 shown in FIG. 6D showing the insulating carbon-based material 210. The epitaxial growth of the process 5068 may be performed by providing fluid precursors for the growth of the desired insulating carbon-based material 210. For example, in order to grow a layer of diamond, precursors such as CH2, CCl4, CH2Cl32, CHCl3, CH3Cl, C2H5Cl as well as a carrier gas such as H2 may be used.

The method 500 may conclude with a process 510 in which VC islands are provided. An exemplary result of the process 510 is illustrated with a device assembly 610 shown in FIG. 6E showing the VC islands 204 provided in the insulating carbon-based material 210, i.e. FIG. 6E illustrates the embodiment where the optional process 508 was implemented. To that end, VCs may be formed within the desired locations where the VC islands 204 are to be provided, e.g. substantially above at least some of the seed-blocking elements 206, using any of the known methods, some of which described above. The VC islands 204 illustrated in FIG. 6E as well as in FIG. 2C, described above, schematically illustrate areas each containing a VC. In general, such areas could alternatively be represented as the diamond 210 with points shown where the VCs are provided. In other words, when the layer of the diamond 210 is used over the buffer layer 208, as shown in FIGS. 6E and 2C, it is not necessary to create openings in the diamond 210 and grow a different material in there as is done to form the assembly shown in FIG. 2B, but, rather, the VCs may just be introduced into the desired locations to form "VC islands" 204 as shown in FIGS. 2C and 6E.

In the embodiments where the optional process 508 is not implemented (i.e. to form the assembly as shown in FIG. 2B), the VC islands 204 may be provided in the process 510 by creating openings of suitable dimensions in the buffer layer 208 in the desired locations where VCs are to be formed, filling the openings with an insulating carbon-based material as described herein, and then forming the VCs within the diamond in the openings. In various embodiments, the openings for the VC islands 204 may have dimensions similar to those of the VC islands 204 described with reference to the method 300, although the openings do not necessarily need to have conical shapes as described above but may have any suitable shapes.

Although not specifically shown in FIG. 5, the method 500 may also, optionally, include a process that involves providing further layers and creating necessary openings over the VC islands 204 provided over the buffer layer 208. Such a process may be similar to the process 310 described above but performed with the assemblies as shown in FIG. 2B or 2C, and, therefore, in the interests of brevity, that description is not repeated here. Quantum circuit assemblies shown in FIGS. 6A-6E or FIGS. 2B and 2C can vary significantly to achieve equivalent or similar results, and, therefore, should not be construed as the only possible implementations of quantum circuit assemblies in accordance with the buffer-based method for integrating VC islands on a semiconductor substrate described herein. In particular, spin qubit device assemblies shown in FIGS. 6A-6E or FIGS. 2B and 2C should not be construed as the only possible implementations of quantum circuit assemblies where one or more VC islands are provided over or in a III-N buffer layer provided over a semiconductor substrate in accordance with the buffer-based method described herein. There are many variations which could be implemented in context of the buffer-based method 500 described above, all of which are within the scope of the present disclosure.

Using Isotopically Purified Materials

In various embodiments of any of the VC-based spin qubits described herein, isotopically purified materials may, optionally, be used to further improve quality of the spin qubit devices.

As used herein, an "isotopically purified material" is a material whose composition of isotopes with nonzero nuclear spin is less than the natural abundance of those isotopes in the material. In other words, an isotopically purified material may include a lower atomic-percent of isotopes with nonzero nuclear spin than the natural abundance of those isotopies in the non-isotopically purified material. Isotopes with nonzero nuclear spin may cause a reduction of the electron spin coherence time in a quantum dot device 100 due to hyperfine coupling of the electron spin to the nuclear spin bath and intrinsic interactions between nuclear spins; reducing the presence of these isotopes in an insulating carbon-based material, or at least in the portions where the VCs are formed, i.e. within the VC islands 204, may improve qubit coherence and thus performance. The isotopically purified materials disclosed herein may be grown by centrifuging suitable precursor materials to isolate different isotopes by mass, and then using only the desired isotopes as precursors for growth of the desired material. In particular, in some embodiments, the insulating carbon-based material 210 or/and the VC islands 204 disclosed herein may include isotopically purified carbon which may include greater than 90 atomic-percent of stable isotopes with zero nuclear spin (and less than 10 atomic-percent of isotopes with nonzero nuclear spin). For example, in some embodiments, the carbon included in the insulating carbon-based material 210 or/and the VC islands 204 may have a 13C content that is less than 1 atomic-percent (e.g., less than 0.5 atomic-percent, or less than 0.2 atomic-percent. In some embodiments, the carbon included in the insulating carbon-based material 210 or/and the VC islands 204 may have a 12C content that is greater than 99 atomic-percent.

Exemplary Qubit Devices

Quantum circuit assemblies, structures, and packages as described above may be included in any kind of qubit devices or quantum processing devices/structures. Some examples of such devices/structures are illustrated in FIGS. 7A-7B, 8, and 9.

Figure 7A:
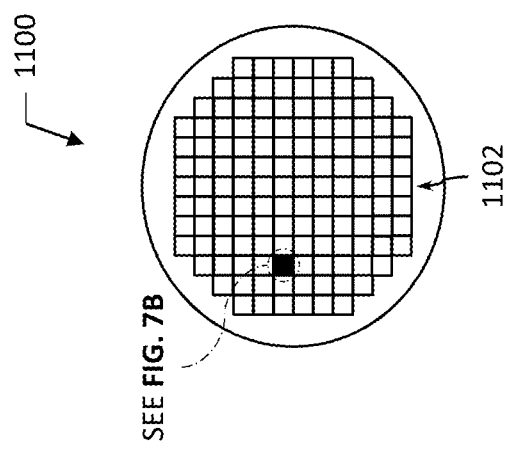
FIGS. 7A and 7B are top views of a wafer and dies that may include one or more of spin qubit device assemblies with VC-based spin qubits integrated on a semiconductor substrate as described herein, according to some embodiments of the present disclosure.
Figure 7B:
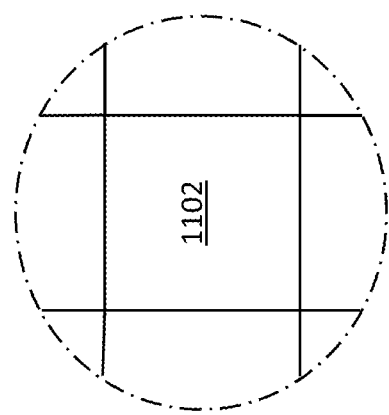

FIGS. 7A-7B are top views of a wafer 1100 and dies 1102 that may be formed from the wafer 1100, according to some embodiments of the present disclosure. The dies 1102 may include any of the quantum circuits or spin qubit device assemblies with VC-based spin qubits integrated on a semiconductor substrate as described herein, e.g., the quantum circuit 100 as shown in FIG. 1 or any further variations of such a circuit as described above, or/and any of the spin qubit device assemblies shown in FIG. 2, 4, or 6, or any further variations of those assemblies as described above. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include one or more quantum circuits as described herein, e.g. the quantum circuit 100 or any further variations of that circuit, including any of the spin qubit device assemblies shown in FIG. 2, 4, or 6, or any further variations of those assemblies as described above, as well as any other IC components. In some embodiments, the wafer 1100 or the die 1102 may include a memory device (e.g., a static random access memory (SRAM) device), a logic device (e.g., AND, OR, NAND, or NOR gate), photonic devices (e.g., light-emitting diodes, photon detectors, or integrated lasers) or any other suitable circuit element. Multiple ones of these devices may be combined on a single die 1102. For example, a memory array formed by multiple memory devices may be formed on a same die 1102 as a processing device (e.g., the processing device 2002 of FIG. 9) or other logic that is configured to store information in the memory devices or execute instructions stored in the memory array.

Figure 8:
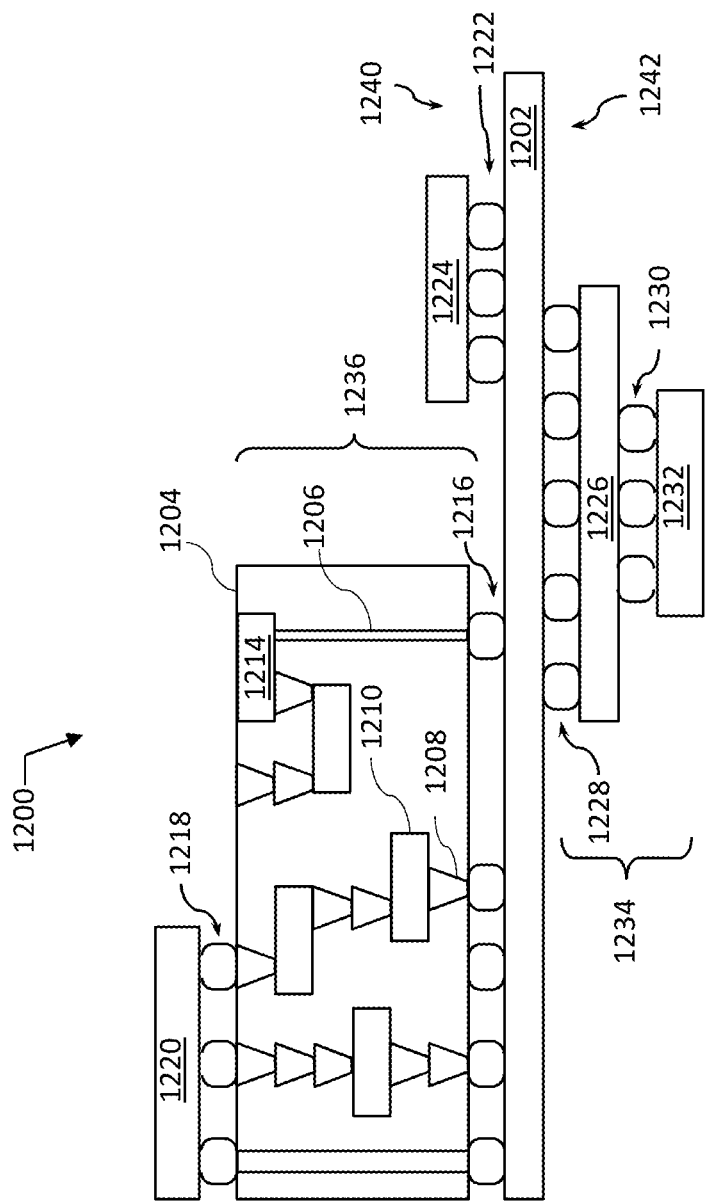
FIG. 8 is a schematic cross-sectional side view of a device assembly that may include one or more of spin qubit device assemblies with VC-based spin qubits integrated on a semiconductor substrate as described herein, according to some embodiments of the present disclosure.

FIG. 8 is a cross-sectional side view of a device assembly 1200 that may include any of the quantum circuits or spin qubit device assemblies with VC-based spin qubits integrated on a semiconductor substrate as described herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 8 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 8), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 8, multiple packages may be coupled to the interposer 1204; indeed, additional interposers may be coupled to the interposer 1204. The interposer 1204 may provide an intervening substrate used to bridge the circuit board 1202 and the package 1220. In some embodiments, the package 1220 may be a quantum circuit device package as described herein, e.g. a package including any of the quantum circuits or spin qubit device assemblies with VC-based spin qubits integrated on a semiconductor substrate as described herein, e.g., the quantum circuit 100 as shown in FIG. 1 or any further variations of such a circuit as described above, or/and any of the spin qubit device assemblies shown in FIG. 2, 4, or 6, or any further variations of those assemblies as described above. In other embodiments, the package 1220 may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 8, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including one or more quantum circuits with qubits as described herein or may be a conventional IC package, for example. In some embodiments, the package 1224 may take the form of any of the embodiments of the packages with any of the quantum circuits or spin qubit device assemblies with VC-based spin qubits integrated on a semiconductor substrate as described herein, e.g., the quantum circuit 100 as shown in FIG. 1 or any further variations of such a circuit as described above, or/and any of the spin qubit device assemblies shown in FIG. 2, 4, or 6, or any further variations of those assemblies as described above.

The device assembly 1200 illustrated in FIG. 8 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example. In some embodiments, one or both of the packages 1226 and 1232 may take the form of any of the embodiments of the packages with any of the quantum circuits or spin qubit device assemblies with VC-based spin qubits integrated on a semiconductor substrate as described herein, e.g., the quantum circuit 100 as shown in FIG. 1 or any further variations of such a circuit as described above, or/and any of the spin qubit device assemblies shown in FIG. 2, 4, or 6, or any further variations of those assemblies as described above.

Figure 9:
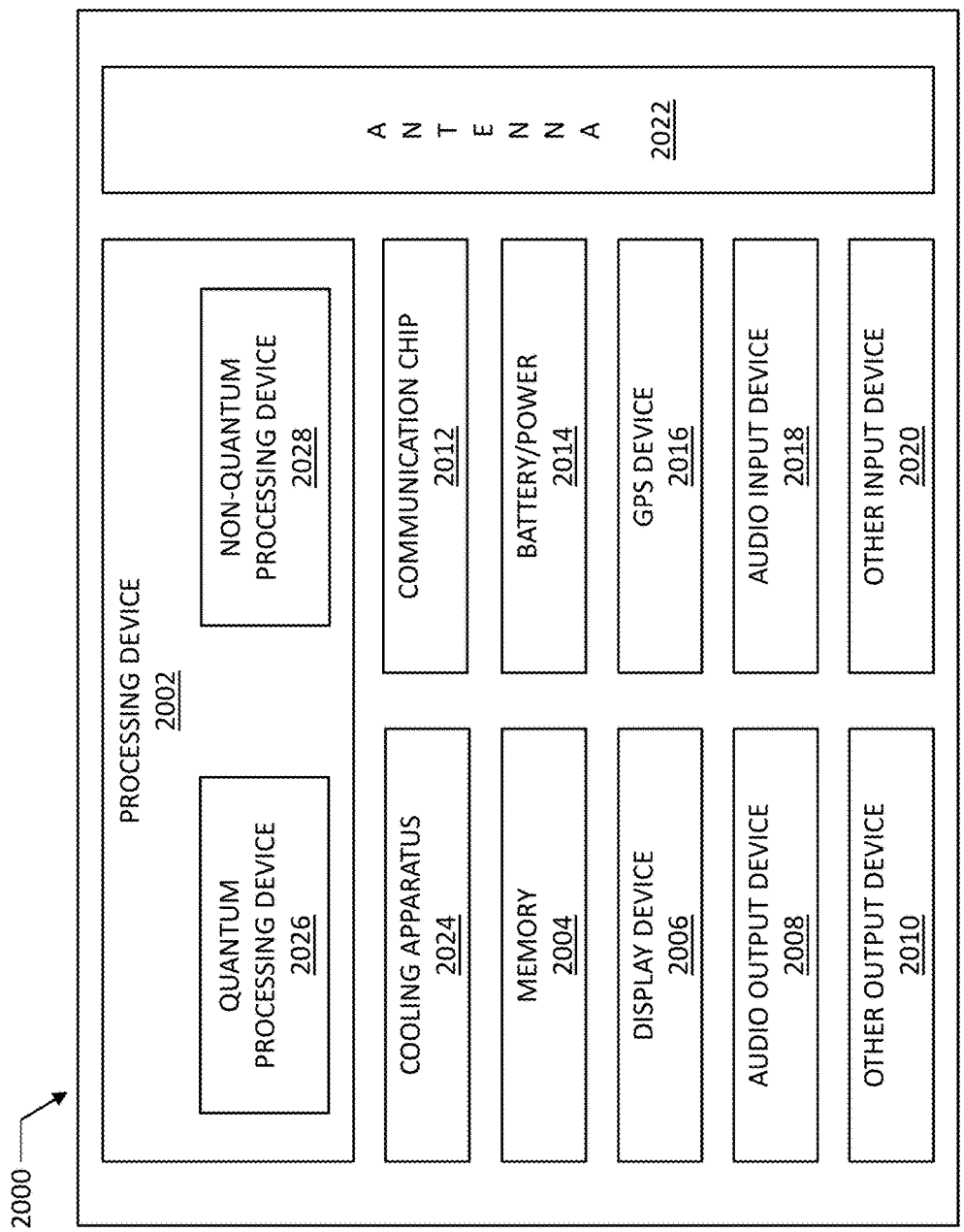
FIG. 9 is a block diagram of an exemplary quantum computing device that may include one or more of spin qubit device assemblies with VC-based spin qubits integrated on a semiconductor substrate as described herein.

FIG. 9 is a block diagram of an exemplary quantum computing device 2000 that may include any of the quantum circuits or spin qubit device assemblies with VC-based spin qubits integrated on a semiconductor substrate as described herein. A number of components are illustrated in FIG. 9 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 9, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum circuits or spin qubit device assemblies with VC-based spin qubits integrated on a semiconductor substrate as described herein, e.g., the quantum circuit 100 as shown in FIG. 1 or any further variations of such a circuit as described above, or/and any of the spin qubit device assemblies shown in FIG. 2, 4, or 6, or any further variations of those assemblies as described above, and may perform data processing by performing operations on the qubits that may be generated in the quantum circuits/devices described herein, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

The quantum computing device 2000 may include a cooling apparatus 2024. The cooling apparatus 2024 may maintain the quantum processing device 2026, in particular the quantum circuits as described herein, at a predetermined low temperature during operation to avoid qubit decoherence and to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2024 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

SELECT EXAMPLES

The following paragraphs provide some select examples of various ones of the embodiments disclosed herein.

Example 1 provides a spin qubit device assembly that includes a substrate including a semiconductor material, and at least one VC island including an insulating carbon-based material, e.g. diamond, having at least one VC, where at least a portion of the VC island is surrounded by the semiconductor material.

Example 2 provides the spin qubit device assembly according to Example 1, where said portion of the VC island (i.e. the portion surrounded by the semiconductor material of the substrate) is integrated in an uppermost layer of the semiconductor material.

Example 3 provides the spin qubit device assembly according to Examples 1 or 2, where said portion of the VC island (i.e. the portion surrounded by the semiconductor material of the substrate) extends into the semiconductor material to a depth between about 20 nm and 1000 nm, including all values and ranges therein, e.g. between about 40 and 200 nm, or between about 50 and 100 nm.

Example 4 provides the spin qubit device assembly according to any one of the preceding Examples, where a cross-section of said portion of the VC island (i.e. the portion surrounded by the semiconductor material of the substrate) in a first plane is larger than a cross-section of said portion of the VC island in a second plane, the second plane being further away from the uppermost surface of the substrate than the first plane.

Example 5 provides the spin qubit device assembly according to any one of the preceding Examples, where said portion of the VC island (i.e. the portion surrounded by the semiconductor material of the substrate) has a substantially conical shape (i.e. has a three-dimensional geometric shape that tapers smoothly from a base closer to the uppermost surface of the substrate, which base may be either substantially flat or curved, to a point called the apex or vertex which is the farthest away from the uppermost surface of the substrate compared to other portions of the VC island) or a substantially truncated cone shape (i.e. a shape similar to the conical shape except that the portion of the shape closes to the apex is truncated along a plane parallel to the base, substantially forming a conical frustum).

Example 6 provides the spin qubit device assembly according to any one of the preceding Examples, further including a layer of a further material between the semiconductor material and said portion of the VC island (i.e. the portion surrounded by the semiconductor material of the substrate).

Example 7 provides the spin qubit device assembly according to Example 6, where the further material includes a surface functionalization material configured to enable, improve, or promote attachment of said portion of the VC island to the semiconductor material, with the examples of such further materials including a material having hydroxyl group (—OH) terminations, a material having hydrogen (—H) terminations, a material having oxygen (—O) terminations, or a material having nitrogen (—N) terminations, all of which are examples of residues which may be left over as a result of using surface functionalization.

Example 8 provides the spin qubit device assembly according to Examples 6 or 7, where the further material has a thickness between about 0.1 and 5 nm, including all values and ranges therein, e.g. between about 0.1 and 1 nm, or between about 0.1 and 0.5 nm, i.e. the further material may be provided as a monolayer or just a few atomic layers.

Example 9 provides the spin qubit device assembly according to any one of the preceding Examples, where said portion of the VC island (i.e. the portion surrounded by the semiconductor material of the substrate) is a first portion, the VC island further having a second portion that is not surrounded by the semiconductor material of the substrate.

Example 10 provides the spin qubit device assembly according to any one of the preceding Examples, where at least a portion of an uppermost surface of the VC island (i.e. the surface farthest away from the base of the substrate) has a convex shape.

Example 11 provides the spin qubit device assembly according to any one of the preceding Examples, where the insulating carbon-based material includes/is diamond.

Example 12 provides the spin qubit device assembly according to any one of the preceding Examples, where the insulating carbon-based material includes/is an isotopically purified carbon.

Example 13 provides the spin qubit device assembly according to Example 12, where the isotopically purified carbon includes 13C isotopes in an amount less than about 1 atomic-percent, e.g. less than about 0.1 atomic-percent, or less than about 0.01 atomic-percent.

Example 14 provides a quantum IC package that includes a semiconductor substrate; a first spin qubit and a second spin qubit, each including a respective VC island that includes an insulating carbon-based material, e.g. diamond, with a VC therein, where at least a portion of the VC island is surrounded by the semiconductor substrate; a resonator associated with the first spin qubit; and a resonator associated with the second spin qubit, each of the resonators configured to collect and enhance ZPL emission from the VC centers of their respective qubits.

Example 15 provides a quantum IC package that includes a semiconductor substrate; a buffer layer over the substrate, the buffer layer including a III-N material; a first spin qubit including a first VC island that includes an insulating carbon-based material, e.g. diamond, having at least one VC therein; a second spin qubit including a second VC island that includes the insulating carbon-based material having at least one VC therein, where each of the first and the second VC island is provided over or at least partially in the III-N material; a resonator associated with the first spin qubit; and a resonator associated with the second spin qubit, each of the resonators configured to collect and enhance ZPL emission from the VC centers of their respective qubits.

Example 16 provides the quantum IC package according to Examples 14 or 15, where a portion of the resonator associated with the first spin qubit is provided over at least a portion of, or over all of, the VC island of the first spin qubit. Similarly, a portion of the resonator associated with the second spin qubit may be provided over at least a portion of, or over all of, the VC island of the second spin qubit.

Example 17 provides the quantum IC package according to Example 16, where said portion of the resonator is one end of the resonator associated with the first spin qubit. Similar statement also applies to the resonator associated with the second spin qubit.

Example 18 provides the quantum IC package according to Example 17, where said one end of the resonator associated with the first spin qubit overlaps with the at least a portion of the VC island by between about 20 and 100 nanometers, including all values and ranges therein. Similar statement also applies to the resonator associated with the second spin qubit.

Example 19 provides the quantum IC package according to any one of Examples 14-18, where the resonator associated with the first spin qubit includes, or is substantially made of, a material having an index of refraction that is same or higher than an index of refraction of the insulating carbon-based material, e.g. the resonator may include, or be made of, diamond or a material that include gallium and phosphorous, e.g. gallium phosphide. Similar statement also applies to the resonator associated with the second spin qubit.

Example 20 provides the quantum IC package according to any one of Examples 14-19, further including a waveguide associated with the first spin qubit; and a waveguide associated with the second spin qubit.

Example 21 provides the quantum IC package according to Example 20, where the waveguide associated with the first spin qubit and the waveguide associated with the second spin qubit form a beam splitter (by being coupled to one another). Coupling the waveguides of different VCs allows entangling photons between the different VCs, thereby entangling the different VCs.

Example 22 provides the quantum IC package according to Examples 20 or 21, where a portion of the waveguide associated with the first spin qubit is provided at a distance between about 10 to 200 nanometers from a portion of the waveguide associated with the second spin qubit so that optical modes within the two waveguides may be allowed to overlap in order to couple, or entangle, the corresponding spin qubits associated with these waveguides.

Example 23 provides the quantum IC package according to any one of Examples 20-22, where the waveguide associated with the first spin qubit includes a structure to support propagation of ZPL emission. Similar statement also applies to the waveguide associated with the second spin qubit.

Example 24 provides the quantum IC package according to any one of Examples 20-23, where the waveguide associated with the first spin qubit includes, or is substantially made of, a material having an index of refraction that is same or higher than an index of refraction of the insulating carbon-based material, e.g. the waveguide may include, or be made of, diamond or a material that include gallium and phosphorous, e.g. gallium phosphide. Similar statement also applies to the waveguide associated with the second spin qubit.

Example 25 provides the quantum IC package according to any one of Examples 20-24, where a portion of the waveguide associated with the first spin qubit is provided at a distance between about 10 to 200 nanometers from the resonator associated with the first spin qubit. Similar statement also applies to the waveguide and the resonator associated with the second spin qubit.

Example 26 provides the quantum IC package according to any one of Examples 20-25, where a portion of the waveguide associated with the first spin qubit is coupled to a photon detector (or a photon counter) in order to infer a spin state of the associated spin qubit. Similar statement also applies to the waveguide associated with the second spin qubit.

Example 27 provides the quantum IC package according to any one of Examples 14-26, further including a first pair of electrodes configured to perform Stark tuning of a resonance frequency of the VC of the first spin qubit. A similar first pair of electrodes may be provided for the second spin qubit.

Example 28 provides the quantum IC package according to any one of Examples 14-27, further including a second pair of electrodes configured to tune a resonance frequency of the resonator associated with the first spin qubit. A similar second pair of electrodes may be provided for the second spin qubit.

Example 29 provides the quantum IC package according to any one of Examples 14-28, further including a radiofrequency (RF) line configured to change a spin state of at least one of the first spin qubit and the second spin qubit.

Example 30 provides the quantum IC package according to any one of Examples 14-29, further including an IC element coupled to the semiconductor substrate by a plurality of interconnects.

Example 31 provides the quantum IC package according to Example 30, where the IC element is one of an interposer, a circuit board, a flexible board, or a package substrate.

In various further Examples, one or more of the first and second spin qubits on the semiconductor substrate within the quantum IC package according to any one of Examples 14 and 16-31 may be implemented as the spin qubit device assembly according to any one of Examples 1-13 (i.e. the features of the spin qubit device assembly according to any one of Examples 1-13 are applicable to any one or both of the first and the second spin qubits within the quantum IC package according to any one of Examples 14 and 16-31).

Example 32 provides a spin qubit device assembly that includes a semiconductor substrate; a buffer layer over the substrate, the buffer layer including a III-N material; and at least one VC island including an insulating carbon-based material, e.g. diamond, having at least one VC, where the VC island is provided over or at least partially in the III-N material.

Example 33 provides the spin qubit device assembly according to Example 32, where the semiconductor substrate includes silicon or germanium.

Example 34 provides the spin qubit device assembly according to Examples 32 or 33, where a lattice constant of the semiconductor substrate is different from a lattice constant of the III-N material by (i.e. there is a lattice mismatch of) at least about 15%, e.g. at least about 17%, or at least about 20%.

Example 35 provides the spin qubit device assembly according to any one of Examples 32-34, further including one or more structures of a dielectric material on the semiconductor substrate, where portions of the buffer layer enclose the one or more structures.

Example 36 provides the spin qubit device assembly according to Example 35, where where the dielectric material includes one or more of a compound including silicon and oxygen (e.g., $SiO_2$), and a compound including hafnium and oxygen (e.g., $HfO_2$).

Example 37 provides the spin qubit device assembly according to Examples 35 or 36, where where a ratio of an area of the semiconductor substrate that is in contact with the dielectric material to an area of the semiconductor substrate that is in contact with the III-N material is at least about 1, e.g. at least about 1.5.

Example 38 provides the spin qubit device assembly according to any one of Examples 32-37, where at least a portion of the at least one VC island is in an uppermost layer of the III-N material (i.e. at least a portion of the VC island is surrounded by the III-N material of the buffer layer).

Example 39 provides the spin qubit device assembly according to any one of Examples 32-37, where at least a portion of the at least one VC island is in an opening in the buffer layer.

Example 40 provides the spin qubit device assembly according to Examples 38 or 39, where said portion of the at least one VC island (i.e. the portion surrounded by the III-N material of the buffer layer) extends into the III-N material to a depth between about 20 nm and 1000 nm, including all values and ranges therein, e.g. between about 40 and 200 nm, or between about 50 and 100 nm.

Example 41 provides the spin qubit device assembly according to any one of Examples 32-37, further including a further layer of the insulating carbon-based material over the buffer layer and the at least one VC island is in the further layer.

Example 42 provides the spin qubit device assembly according to any one of Examples 32-41, where a distance from the semiconductor substrate to an uppermost surface of the buffer layer is between about 500 and 5000 nanometers, including all values and ranges therein, e.g. between about 1000 and 2000 nanometers.

Example 43 provides the spin qubit device assembly according to any one of Examples 32-42, where the at least one VC is a nitrogen VC.

Example 44 provides the spin qubit device assembly according to any one of Examples 32-43, where the insulating carbon-based material includes/is diamond.

Example 45 provides the spin qubit device assembly according to any one of Examples 32-44, where the insulating carbon-based material includes/is an isotopically purified carbon.

Example 46 provides the spin qubit device assembly according to Example 45, where the isotopically purified carbon includes 13C isotopes in an amount less than about 1 atomic-percent, e.g. less than about 0.1 atomic-percent, or less than about 0.01 atomic-percent.

In various further Examples, one or more of the first and second spin qubits on the semiconductor substrate within the quantum IC package according to any one of Examples 15-31 may be implemented as the spin qubit device assembly according to any one of Examples 32-46 (i.e. the features of the spin qubit device assembly according to any one of Examples 32-46 are applicable to any one or both of the first and the second spin qubits within the quantum IC package according to any one of Examples 15-31).

In various further Examples, the spin qubit device assembly and/or the quantum IC package according to any one of the preceding Examples may be implemented within any suitable quantum computing device, e.g. as specified in the Examples below.

Example 47 provides a quantum computing device that includes a quantum processing device and a memory device.

The quantum processing device includes a die including a quantum circuit assembly according to any one of the preceding Examples, the quantum circuit assembly including a plurality of spin qubits according to any one of the preceding Examples, or/and that includes the quantum IC package with a plurality of spin qubits according to any one of the preceding Examples. The memory device is configured to store data generated by the plurality of spin qubits during operation of the quantum processing device.

Example 48 provides the quantum computing device according to Example 47, further including a cooling apparatus configured to maintain a temperature of the quantum processing device below 5 degrees Kelvin.

Example 49 provides the quantum computing device according to Examples 47 or 48, where the memory device is configured to store instructions for a quantum computing algorithm to be executed by the quantum processing device.

Example 50 provides the quantum computing device according to any one of Examples 47-49, further including a non-quantum processing device coupled to the quantum processing device.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A spin qubit device assembly comprising:
a substrate including a semiconductor material; and
at least one vacancy center (VC) island including an insulating carbon-based material having at least one VC,
wherein at least a portion of the VC island is surrounded by the semiconductor material.

2. The spin qubit device assembly according to claim 1, wherein said portion of the VC island is integrated in an uppermost layer of the semiconductor material.

3. The spin qubit device assembly according to claim 1, wherein said portion of the VC island extends into the semiconductor material to a depth between 20 nanometers and 1000 nanometers.

4. The spin qubit device assembly according to claim 1, wherein a cross-section of said portion of the VC island in a first plane is larger than a cross-section of said portion of the VC island in a second plane, the second plane being further away from the uppermost surface of the substrate than the first plane.

5. The spin qubit device assembly according to claim 1, wherein said portion of the VC island has a substantially conical shape or a substantially truncated cone shape.

6. The spin qubit device assembly according to claim 1, further comprising a layer of a further material between the semiconductor material and said portion of the VC island, wherein the further material includes a material having hydroxyl group (OH) terminations, a material having hydrogen (—H) terminations, a material having oxygen (—O) terminations, or a material having nitrogen (—N) terminations, and has a thickness between 0.1 and 5 nanometers.

7. The spin qubit device assembly according to claim 1, wherein said portion of the VC island is a first portion, the VC island further having a second portion that is not surrounded by the semiconductor material.

8. The spin qubit device assembly according to claim 1, wherein at least a portion of an uppermost surface of the VC island has a convex shape.

9. The spin qubit device assembly according to claim 1, wherein the insulating carbon-based material includes diamond.

10. The spin qubit device assembly according to claim 1, wherein the insulating carbon-based material includes an isotopically purified carbon, wherein the isotopically purified carbon includes 13C isotopes in an amount less than 1 atomic-percent.

11. A quantum integrated circuit (IC) package, comprising:
a semiconductor substrate;
a first spin qubit and a second spin qubit, each comprising a vacancy center (VC) island that includes an insulating carbon-based material with a VC therein, wherein at least a portion of the VC island is surrounded by the semiconductor substrate;
a resonator associated with the first spin qubit; and
a resonator associated with the second spin qubit.

12. The quantum IC package according to claim 11, wherein one end of the resonator associated with the first spin qubit is over at least a portion of the VC island of the first spin qubit.

13. The quantum IC package according to claim 12, wherein said one end of the resonator associated with the first spin qubit overlaps with the at least a portion of the VC island by between 20 and 100 nanometers.

14. The quantum IC package according to claim 11, further comprising:
a waveguide associated with the first spin qubit; and
a waveguide associated with the second spin qubit.

15. The quantum IC package according to claim 14, wherein the waveguide associated with the first spin qubit and the waveguide associated with the second spin qubit form a beam splitter.

16. The quantum IC package according to claim 14, wherein a portion of the waveguide associated with the first spin qubit is at a distance between 10 to 200 nanometers from a portion of the waveguide associated with the second spin qubit.

17. The quantum IC package according to claim 14, wherein the waveguide associated with the first spin qubit comprises a structure to support propagation of zero-phonon-line (ZPL) emission.

18. The quantum IC package according to claim 14, wherein a portion of the waveguide associated with the first spin qubit is at a distance between 10 to 200 nanometers from the resonator associated with the first spin qubit.

19. The quantum IC package according to claim 14, wherein a portion of the waveguide associated with the first spin qubit is coupled to a photon detector.

20. The quantum IC package according to claim 11, further comprising a first pair of electrodes to perform Stark tuning of a resonance frequency of the VC of the first spin qubit, and a second pair of electrodes to tune a resonance frequency of the resonator associated with the first spin qubit.

21. The quantum IC package according to claim 11, further comprising a radiofrequency (RF) line to change a spin state of at least one of the first spin qubit and the second spin qubit.

22. The quantum IC package according to claim 11, further comprising an IC element coupled to the semiconductor substrate by a plurality of interconnects, wherein the IC element is one of an interposer, a circuit board, a flexible board, or a package substrate.

23. A spin qubit device assembly comprising:
a semiconductor substrate;
a buffer layer over the substrate, the buffer layer comprising a III-N material; and
at least one vacancy center (VC) island including an insulating carbon-based material having at least one VC,
wherein the VC island is over or at least partially in the III-N material.

24. The spin qubit device assembly according to claim 23, wherein a lattice constant of the semiconductor substrate is different from a lattice constant of the III-N material by at least 15%.

25. The spin qubit device assembly according to claim 23, further comprising one or more structures of a dielectric material on the semiconductor substrate, where portions of the buffer layer enclose the one or more structures, and wherein where a ratio of an area of the semiconductor substrate that is in contact with the dielectric material to an area of the semiconductor substrate that is in contact with the III-N material is at least 1.

26. The spin qubit device assembly according to claim 23, where at least a portion of the at least one VC island is in an uppermost layer of the III-N material.

27. The spin qubit device assembly according to claim 25, where the portion of the at least one VC island extends into the III-N material to a depth between about 20 nanometers and 1000 nanometers.

28. The spin qubit device assembly according to claim 23, further including a further layer of the insulating carbon-based material over the buffer layer and the at least one VC island is in the further layer.

29. The spin qubit device assembly according to claim 23, where the insulating carbon-based material includes an isotopically purified carbon.

30. The spin qubit device assembly according to claim 29, where the isotopically purified carbon includes 13C isotopes in an amount less than about 1 atomic-percent.

31. A quantum computing device, comprising:
a quantum processing device comprising a plurality of spin qubits; and
a memory, configured to store data generated by the plurality of spin qubits during operation of the quantum processing device,
wherein:
the quantum processing device includes a spin qubit device assembly that includes a semiconductor material, and
each of the plurality of spin qubits comprises a vacancy center (VC) island that includes an insulating carbon-based material having at least one VC, wherein the VC island is over or at least partially in the semiconductor material.

32. The quantum computing device according to claim 31, wherein the semiconductor material is a III-N material.

33. The quantum computing device according to claim 32, wherein:
the III-N material is a first semiconductor material,
the spin qubit device assembly further includes a second semiconductor material,
the first semiconductor material is over the second semiconductor material, and
a lattice constant of the second semiconductor material is different from a lattice constant of the III-N material by at least 15%.

34. The quantum computing device according to claim 31, wherein the memory device is configured to store instructions for a quantum computing algorithm to be executed by the quantum processing device.

35. The quantum computing device according to claim 31, wherein a cross-section of the portion of the VC island in a first plane is larger than a cross-section of said portion of the VC island in a second plane.

* * * * *

UNITED STATES PATENT AND TRADEMARK OFFICE
CERTIFICATE OF CORRECTION

PATENT NO. : 10,347,834 B2
APPLICATION NO. : 15/928220
DATED : July 9, 2019
INVENTOR(S) : Nicole K. Thomas et al.

Page 1 of 1

It is certified that error appears in the above-identified patent and that said Letters Patent is hereby corrected as shown below:

In the Drawings

Drawing sheet 3 of 14, in FIG. 3, Line 1, Reference Numeral 302, delete "OPENNGS" and insert -- OPENINGS --, therefor.

Drawing sheet 3 of 14, in FIG. 3, Line 1, Reference Numeral 308, delete "OPENNGS" and insert -- OPENINGS --, therefor.

In the Claims

In Column 31, Line 60, in Claim 6, delete "(OH):" and insert -- (-OH) --, therefor.

Signed and Sealed this
Tenth Day of September, 2019

Andrei Iancu
*Director of the United States Patent and Trademark Office*